United States Patent [19]

Ceccon et al.

[11] Patent Number: 4,635,192
[45] Date of Patent: Jan. 6, 1987

[54] SELF CONFIGURING BUS STRUCTURE FOR COMPUTER NETWORK

[75] Inventors: Claude R. Ceccon; Paul C. Mioduski, both of Tucson, Ariz.

[73] Assignee: Tri Sigma Corporation, Scottsdale, Ariz.

[21] Appl. No.: 558,778

[22] Filed: Dec. 6, 1983

[51] Int. Cl.[4] .................... G06F 13/00; G06F 13/40
[52] U.S. Cl. .................................. 364/200; 361/415
[58] Field of Search ... 364/200 MS File, 900 MS File; 361/415

[56] References Cited

U.S. PATENT DOCUMENTS

| Re. 31,318 | 7/1983 | Kaufman et al. | 364/200 |
| 4,151,580 | 4/1979 | Struger et al. | 361/415 |
| 4,155,109 | 5/1979 | Finch et al. | 361/413 |
| 4,181,936 | 1/1980 | Kober | 364/200 |
| 4,334,261 | 6/1982 | Gonzales | 361/426 |
| 4,360,870 | 11/1982 | McVey | 364/200 |
| 4,462,029 | 7/1984 | Neumann et al. | 340/825.5 |
| 4,524,428 | 6/1985 | Grinsberg et al. | 364/900 |
| 4,525,830 | 6/1985 | Cohen et al. | 370/60 |
| 4,587,596 | 5/1986 | Bunnell | 361/398 |

Primary Examiner—Archie E. Williams
Attorney, Agent, or Firm—Cahill, Sutton & Thomas

[57] ABSTRACT

A computer bus structure includes a plurality of separate bus segments on a mother board. Plugging in of each of a plurality of interface boards automatically connects the right-hand portion of a particular bus segment to the left-hand portion of an adjacent bus segment so that a local bus of the needed length is created from the separate bus segments by the plugging of a processor board and a plurality of interface boards into successive adjacent connector slots, respectively, of the mother board. Insertion of processor boards into a particular connection slot of the mother board prevents the two bus segments adjacent thereto from being connected.

7 Claims, 25 Drawing Figures

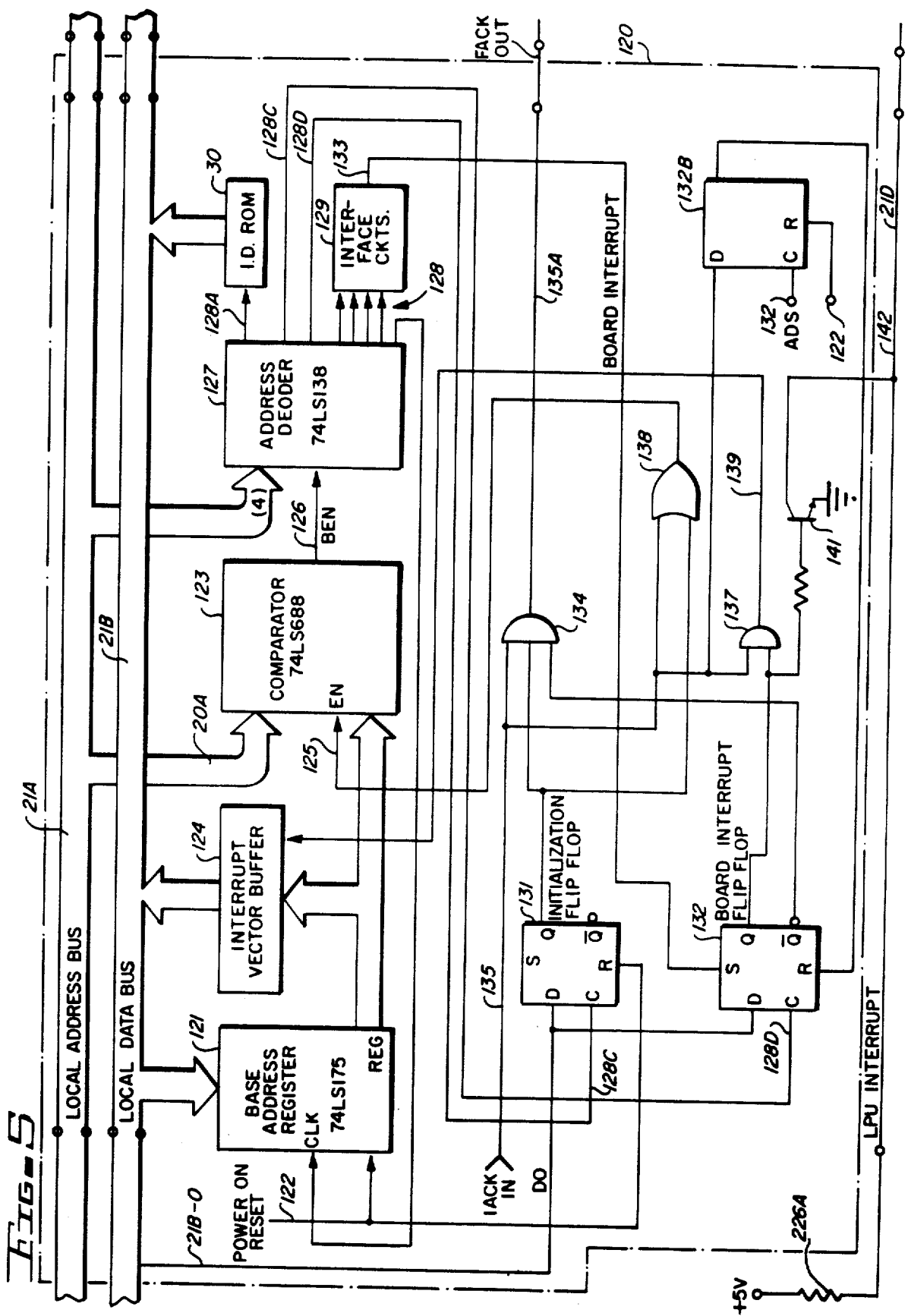

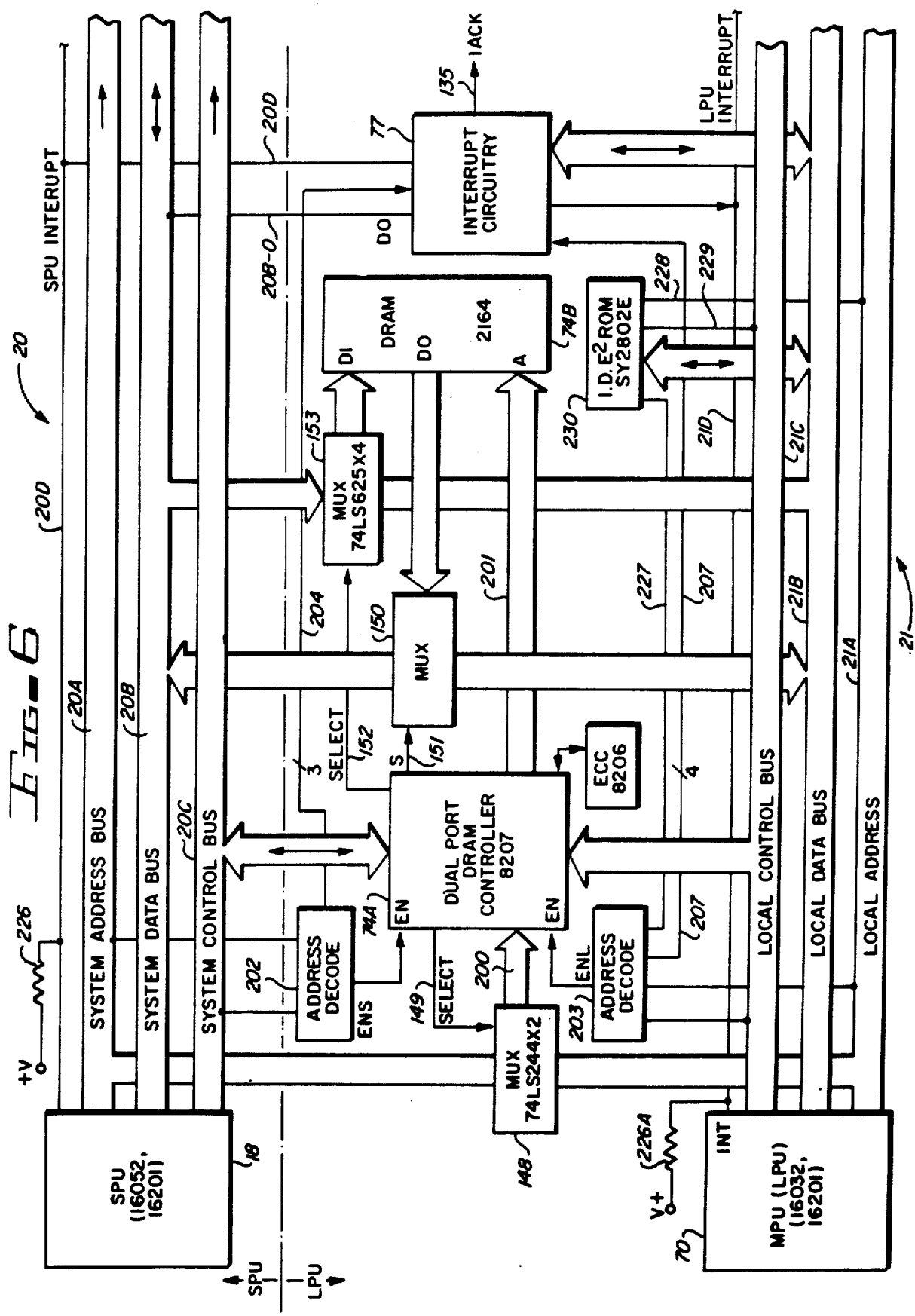

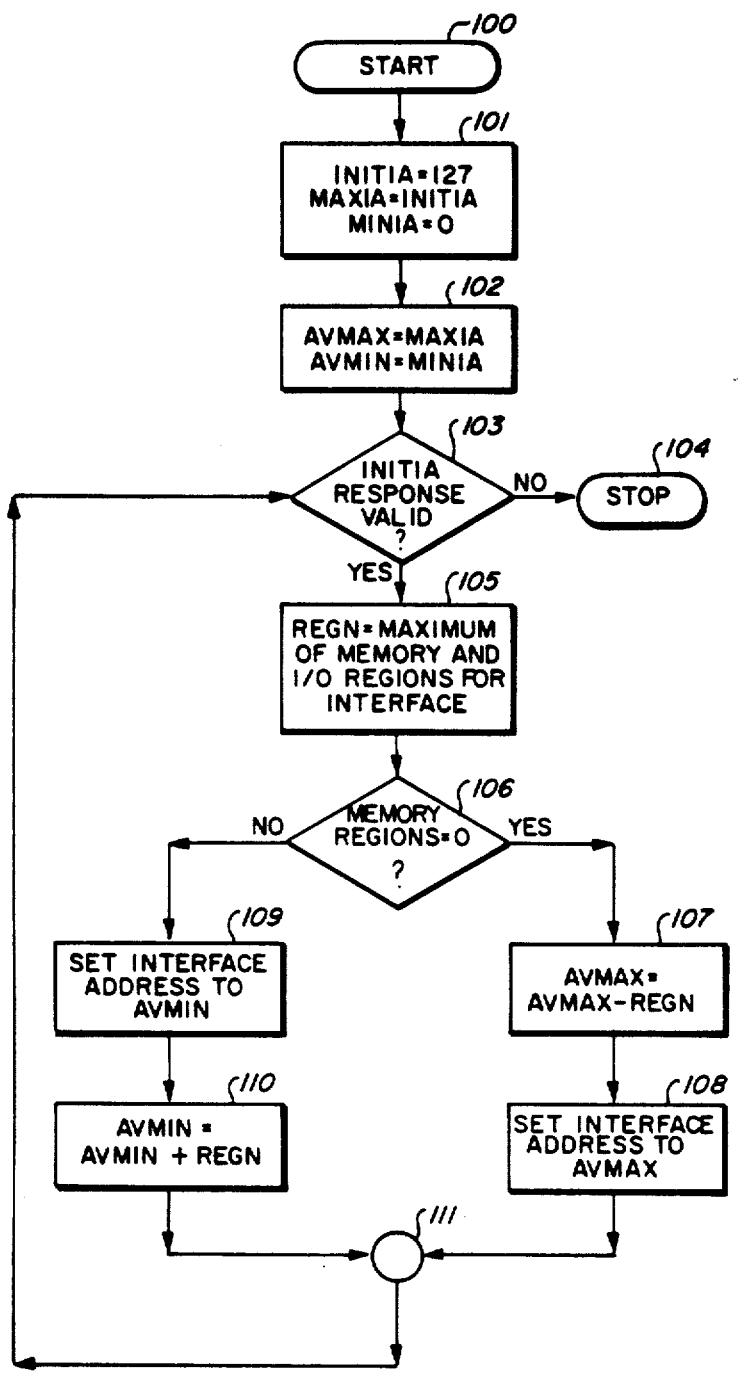
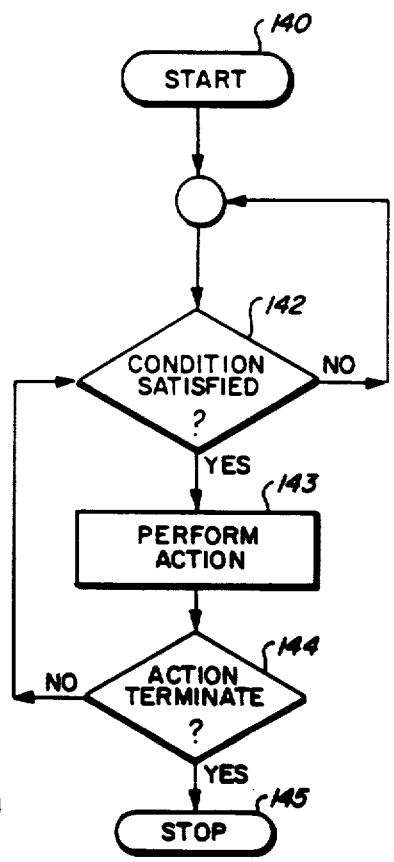
Fig-8
Fig-9

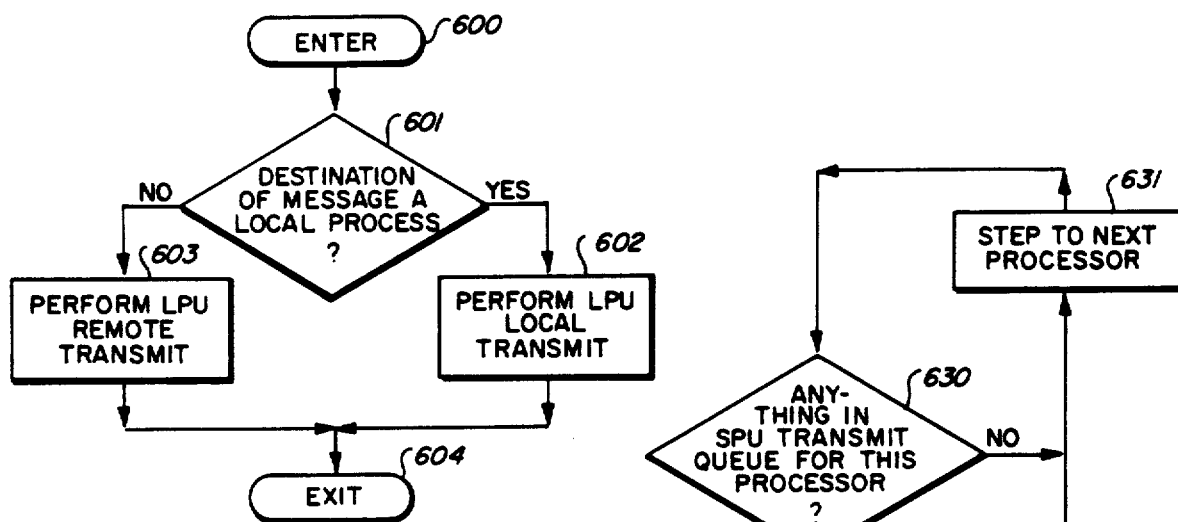
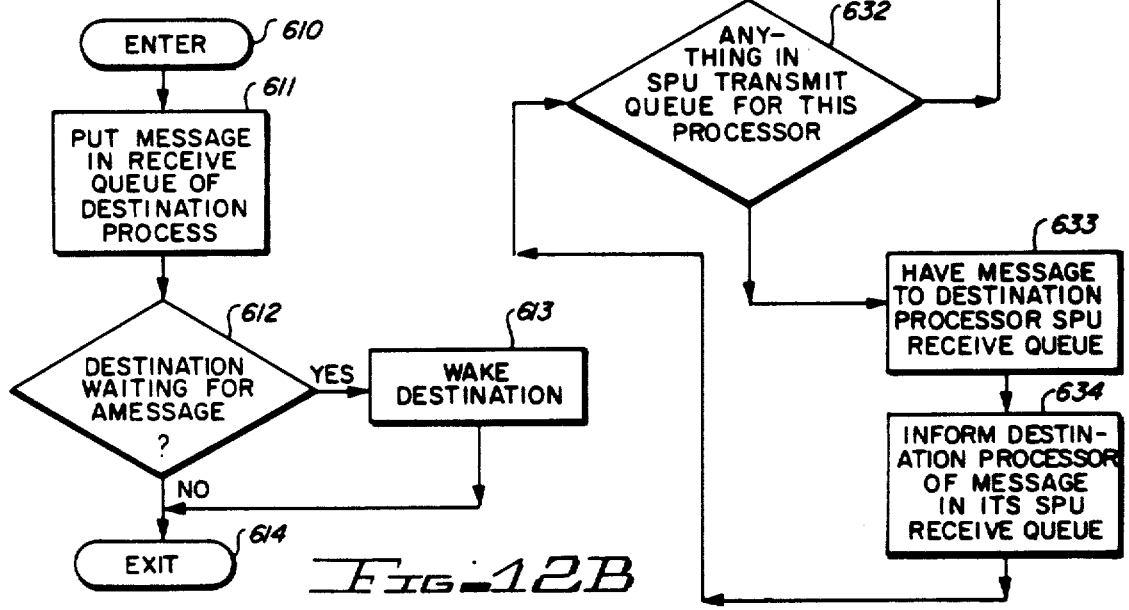
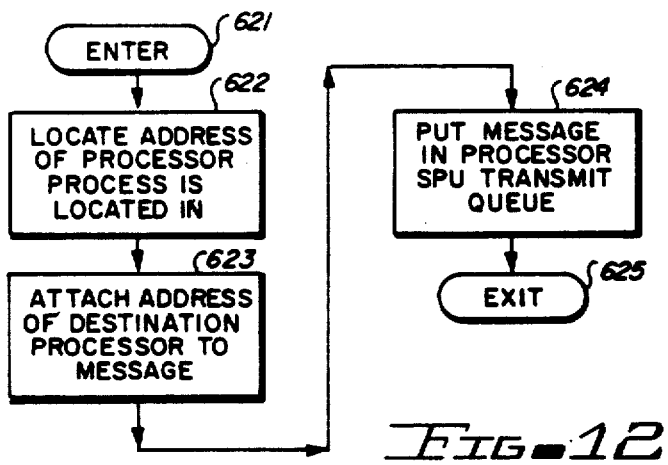

SELF CONFIGURING BUS STRUCTURE FOR COMPUTER NETWORK

BACKGROUND OF THE INVENTION

The invention relates to computer networks, especially computer networks having a large number of nodes, for example, up to one hundred, and relates more particularly to networks which automatically reconfigure themselves when hardware modules or software modules are added to or removed from the network.

Various computer networks are known in which multiple individual computers are interconnected and cooperate in various ways with each other. For example, one well known computer network is widely marketed under the trademark ETHERNET. For more general information on computer networks, see the textbook "Computer Networks", by A. S. Tannenbaum, Prentice-Hall, Inc., 1981. Also see U.S. Pat. No. 4,181,936, which represents the closest prior art presently known. Other U.S. patents that generally disclose computer networks include U.S. Pat. Nos. 3,735,365, 4,181,936, 3,753,234, 3,934,232, 3,818,114, 3,710,351, 4,099,233, 4,079,488, 4,110,823, 3,480,914, 3,593,300, 3,629,854, 4,240,140, 4,385,350 and 4,360,869.

One area of growth in the use of computer networks has been in the field of "factory control", i..e., use of computer networks to accomplish control of manufacturing processes and controlling robots in manufacturing operations. Although state-of-the-art microprocessors and microcomputers have quite limited computing power, they nevertheless have sufficient computing power to perform one or more related or unrelated control functions. But they do not have enough computing power to control all related interfaces in the system. In accordance with the concept of computer networking, additional processors or microcomputers are connected to the same bus, i.e., the network system bus, in order to provide computing needed for controlling additional processing operations, robots, etc. In many instances, there is no requirement for the separate processors to be able to communicate with each other, but in other instances, it would be very desirable if they could efficiently communicate with each other.

The prior networking systems have had some serious shortcomings, including the requirement of requiring custom wiring or rewiring of hardware when additional processors or I/O interface boards are added to the system. Furthermore, addition of additional processors and/or "interfaces" has generally required that the software in the computer network also be modified, usually requiring considerable time, effort and expense, in order to allow continued operation of the computer network. In computer networks in which there are a large number (more than four or five) separate processors, bus arbitration systems including complex hardware and software have been required. The amount of time each processor spends "waiting" for access to the network system bus rises rapidly as the number of processors increases. In factory control environments, reliability is of extreme importance for network control systems, since system "down time" can be extremely expensive. Therefore, it is extremely important in factory control computer systems to avoid hardware and software errors that typically accompany expansion or modification of the system. As mentioned above, custom hardware reconfiguration and software modification is usually required and errors frequently occur. For example, strapping switches frequently are improperly reset when new modules are added to the systems. Software modifications and software "modules" added to the system frequently contain errors and need considerable debugging to make the entire system function properly.

In prior network systems in which multiple processors and their associated memories are connected to a common network system bus, a particular processor that requests access to the system bus often has to wait in a "queueing" line, unless there is complex software in a system that maintains that processor's position in the queueing line while it continues another task.

In prior networking systems, every time a new function is added to a new network, every processor in the system needs to know how to obtain acess to the new function. This ordinarily requires modification of all of the software programs already in the system, since each of the local processors in prior systems completely effectuate their own messages.

Indefinite amounts of waiting time for a processor requesting access to the network bus are unacceptable in a real time operating system. In order to avoid this problem, some prior systems, for example, the Intel MULTI-BUS structure, has been used in conjunction with dual port random access memories which isolate the various local processors from the network bus. This technique has the advantage that it eliminates the requirement for a processor initiating a communication and a destination processor to both stop their present tasks and make themselves available in order to accomplish the communication between them, but the initiating processor needs to stop its present task and make itself available until the message is communicated.

A practical limitation of previous networking systems is related to the physical structure of the printed circuit boards and the mother board into which the various boards (including the processors and the interface boards) are plugged. Some manufacturers have provided "piggyback" boards which are plugged into a main processor board, but this is a very clumsy approach and limits the number of interface boards that can be used. Another approach that has been used is to run ribbon cables from connectors on various processor boards to a separate board rack into which interface boards are connected. Again, this has been a clumsy solution. Another approach that has been used is to provide separate "local" buses for the individual processors. But this approach has generally required "custom" wiring when additional interface boards are added to the system, because there has been no practical way of achieving a satisfactory length for the local printed circuit conductors constituting the local buses as additional interface boards are plugged in.

Up to now, no one has ever provided a satisfactory solution of the problems associated with a computer network that needs to be operable on any scale from very small (wherein only one or two processors are required) to very large (where, for example, up to one hundred or more processors are needed). No one has adequately addressed or solved the problems that arise when it is desired to add computing power to a preexisting computer network in which additional computing power is required in such a manner that tasks presently assigned to certain processors need to be shared with the newly added processors, without requiring extensive hardware, and/or especially software modification.

Up to now, no one has solved the problems associated with long waiting times by individual local processors that need to transmit messages to other processors when large numbers of local processors are connected to the network and concurrently request access to the system bus.

SUMMARY OF THE INVENTION

Accordingly, it is an object of the invention to provide a computer network that can be conveniently scaled from small scale operation with only one or a few processors to a large number of processors.

It is another object of the invention to provide a computer network in which a large number of processors can be added without proportionately increasing the amount of time that is required for a particular processor to spend sending and/or receiving messages to other processors.

It is another object of the invention to greatly reduce the complexity of the problems associated with complex bus arbitration schemes of the prior art.

It is another object of the invention to provide a computer network which can be expanded by merely plugging in additional processors or interface modules and which is operable without modification of either hardware or software presently in the system.

It is another object of the invention to avoid the need for resetting strapping switches when interfaces (i.e., input/output interface circuit boards) or processors are added to or removed from a computer network system.

It is another object of the invention to provide a completely modular network system, in which both hardware and software are modular and can be added to or removed from the system without undue difficulty.

It is another object of the invention to provide a computer network system that automatically reconfigures itself when hardware modules or software modules are added to or removed.

Briefly described, and in accordance with one embodiment thereof, the invention provides a reconfigurable bus structure in a system including a mother board, a processor board including a first processor, and a plurality of interface boards, a plurality of separate bus segments being disposed on the mother board, each of which bus segments includes a plurality of separate bus conductors each having a first end and a second end, first and second sets of interface board connector conductors on each of the interface boards, a first set of processor board connector conductors on a processor board, a processor board connector for effectuating plug-in connection of the first set of processor board connector conductors to corresponding first ends of the bus conductors of a first one of the bus segments, an interface board connector for effectuating plug-in connection of the first set of interface board connector conductors to corresponding second ends of the bus conductors of the first bus segments and plug-in connection of the second set of interface board connector conductors to corresponding first ends of the bus conductors of a second one of the bus segments, and shorting elements on the first interface board electrically coupling the corresponding first and second sets of interface board conductors together. Insertion of the first interface board and the first processor board into adjacent slots of the mother board creates a local bus including the first and second segments. Plugging in of additional interface boards in successively adjacent slots of the mother board similarly extends the local bus to include additional corresponding bus segments. A plurality of local buses is thereby automatically created on the mother bus by connecting a plurality of groups each including a processor board and a plurality of associated interface boards into consecutive slots of the mother board. The processor board connector conductors make electrical connection to only one bus segment, electrically isolating the different local buses from each other.

BRIEF DESCRIPTION OF THE DRAWINGS

FIG. 5 is a detailed block diagram of an interface circuit in the diagram of FIG. 1.

FIG. 6 is a detailed block diagram showing interface circuitry included in the local processors in the diagram of FIG. 1.

FIG. 8 is a flow diagram of an initialization procedure executed by the local processors in the block diagram of FIG. 1.

FIG. 9 is a flow chart of an initialization program executed by the local processors in FIG. 1 in conjunction with the system processor therein to assign addresses to the individual local processors.

FIGS. 12A–12F constitute a program flow chart of the message-passing procedure between different user programs that can be executed by the system of FIG. 1.

DESCRIPTION OF THE INVENTION

Figure 1:
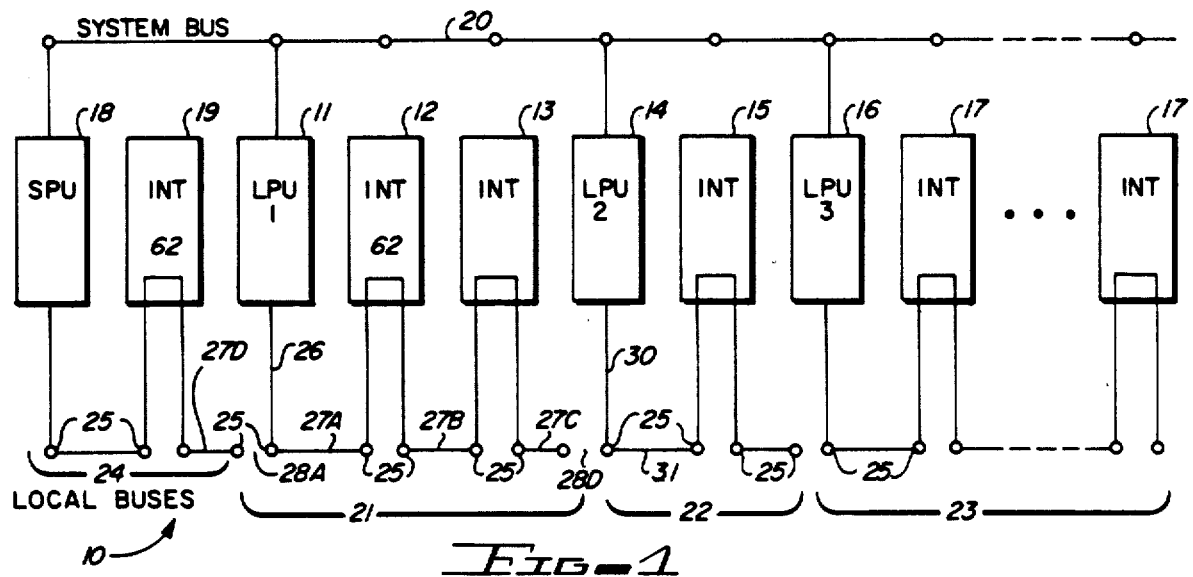
FIG. 1 is a block diagram of the self-configuring computer network system of the present invention.

Before describing the basic functions that the self configuring computer network system of the present invention provides in order to meet the foregoing objectives, it will be helpful to first understand the basic structure of the system as indicated in FIG. 1, and the structure of the system processor unit (SPU), local processor units (LPUs), and interface circuits or boards. The structure shown in FIGS. 1–4 will therefore be described first. Then, the local bus interface circuitry and its basic operation will be described with reference to FIG. 5 and the system bus interface and its basic operation will be described with reference to FIGS. 6, 6A and 6B. Then, initialization procedures, object building, and message passing processes that are parts of the present invention will be described in detail.

Referring now to FIG. 1, self-configuring computer network 10 includes a system bus 20 which is connected to system processor 18 and a plurality of local processors 11, 14, 16, etc. System processor 18 is occasionally alternately referred to herein as the "communications processor", as its primary function is to coordinate communications between user programs or "processes" that reside in the various local processors 11, 14, etc.

Each of the local processors is also connected to a "local bus". For example, local processor 11 is connected to local bus 21, local processor 12 is connected to local bus 22 and local processor 16 is connected to local bus 23.

Figure 13:
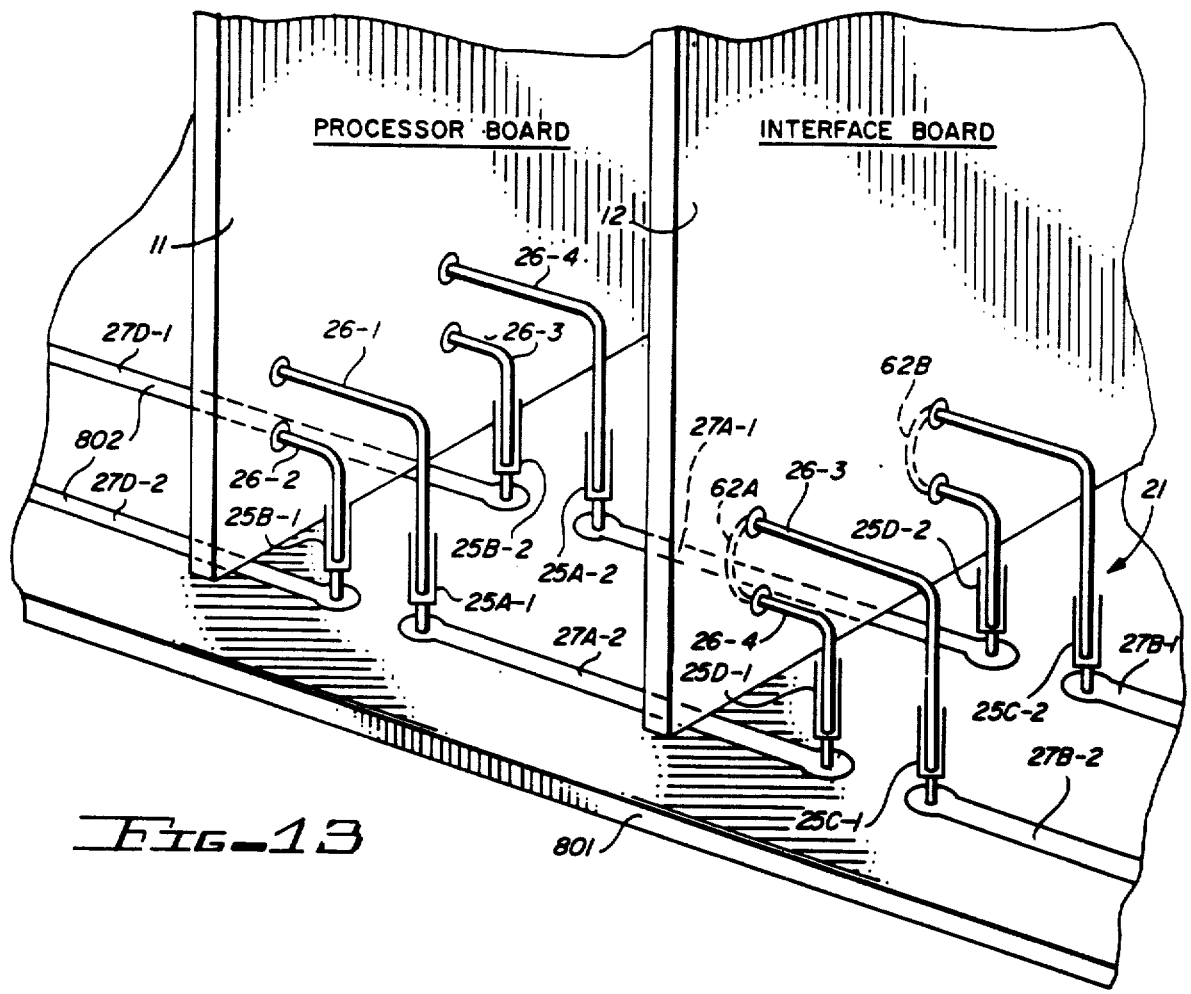
FIG. 13 is a perspective diagram that better illustrates the connections to the segmented local bus of FIG. 1.

As shown in FIGS. 1 and 13, each local bus is connected to a plurality of removable interface circuits, referred to herein as interface boards. Interface boards 12 and 13 are connected to local bus 21, interface board 15 is connected to local bus 22 and interface boards 17 are connected to local bus 23. Each local processor, each interface board, and the system processor is disposed on a separate printed circuit board with an edge connecter that is pluggable into a "mother board" 801 (FIG. 13) on which the local buses and the systems bus are printed.

System processor 18 also has a local bus 24 connected to it, to which one or more interface boards such as 19 can be connected (although often it would not be necessary for system processor 18 to utilize a local bus.)

In accordance with the present invention, each of the local buses such as 21 through 24 is "segmented" on the mother board 801 into which the various processor boards and interface boards are inserted. Any number of local processor boards and associated interface boards can be plugged into the mother board in such a way as to automatically "define" the needed local buses to effectuate communication between the local processors and their associated interface boards. The physical act of plugging in a local processor board connects it to only one adjacent segment of the local bus structure. The act of plugging in an interface board in the adjacent slot of the mother board automatically connects both adjacent local bus segments together and hence, extends the local bus to the next adjacent slot. However, plugging in a local processor board breaks the connection, because it does not connect one segment of the local bus to the next.

This structure can be understood by reference to FIGS. 1 and 13, in which, (by way of example) local processor 11 has an edge connector conductor 26. Local bus 21 consists of three "segments" 27A, 27B, and 27C, etc. These three segments are separated from each other by edge connector receiving slots 28A, 28B, 28C, and 28D. The opposed ends of each of the bus segments 27A, 27B, 27C, etc., each of which is composed of corresponding segments of all of the conductors that constitute local bus 21, are connected to edge connector receiving slot conductors. FIG. 13 illustrates this structure more clearly. In FIG. 13, reference numeral 801 designates the mother board. Reference numerals 27A-1 and 27A-2 designate several of the conductors of local bus segment 27A in FIG. 1, reference numerals 27D-2 and 27D-2 designate several conductors of local bus segment 27D in FIG. 1 and reference numerals 27B-2 and 27B-2 designate several conductors of local bus segment 27B in FIG. 1. Reference numerals 25A-1 and 25B-1 designate female connectors which are connected to local bus segment conductors 27A-2 and 27D-2, respectively. Rigid male connector conductors 26-1 and 26-2 are attached to the front side of local processor board 11, and are connected to appropriate conductors (not shown) thereon. Male connector conductors 26-1 and 26-2 extend into female connectors 25A-1 and 25B-1, respectively, but are not short circuited together and do not electrically connect local bus segment conductors 27D-2 and 27A-2 together. Similarly, male connector conductors 26-3 and 26-4 are not short circuited together and do not electrically connect bus conductors 27A-1 and 27D-1 together. In contrast, however, each pair of male connector conductors such as 26-3 and 26-4 on every interface board such as 12 is short-circuited together by a "jumper" such as 62A or 62B in FIG. 13. Hence, local bus conductor 27B-2 is shorted to local bus conductor 27B-2, and local bus conductor 27A-1 is shorted to local bus conductor 27B-1. Thus, inserting a processor board such as 11 does not extend the local bus 20 by shorting corresponding conductors of adjacent local bus segments together, but inserting interface boards such as 12 into consecutively adjacent "slots" (i.e., female connectors such as 25A-1 and 25B-1) of mother board 801 does extend the local bus to the needed length.

Thus, the edge connectors of each of the interface boards shown in FIG. 1 includes a plurality of edge connectors which, in effect, "jumper" the corresponding edge connector slot conductors together by means of the jumpers 62. For example, if interface board 12 is inserted into slot 28B, the edge connector jumper conductors, designated by reference numeral 29, electrically connect the conductors of local bus segment 27A to corresponding ones of local bus segment 27B. Thus, it can be seen how continued insertion of interface cards 12, 13, etc. into consecutively adjacent slots extends the length of local bus 21 as needed.

The interfaces (i.e., interface boards) such as 12, 13, 15, etc. typically include memory, digital-to-analog converters, analog-to-digital converters, keyboard monitors, disc controllers, etc.

Figure 2:
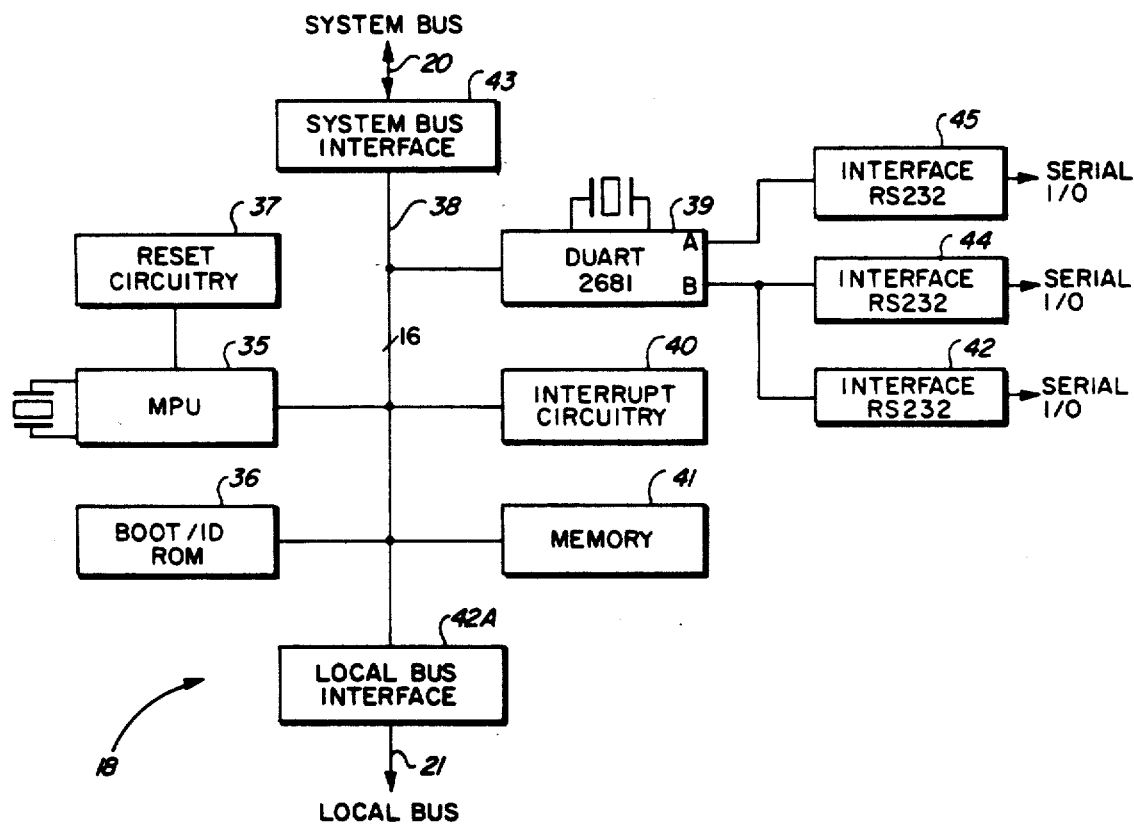
FIG. 2 is a block diagram of the system processor unit (SPU) in the diagram of FIG. 1.

Referring now to FIG. 2, system processor 18 of FIG. 1 includes a system bus interface circuit 43, which simply includes ordinary three-state buffers, some of which are bi-directional. Both system bus 20 and internal bus 38 include an address bus, a data bus, and a control bus including one or more interrupt conductors and an acknowledge conductor. A microprocessor 35 is a connected to internal bus 38. Power on reset circuitry 37 is connected to microprocessor 35 and, in fact, is connected to other circuitry in the system requiring a power on reset signal, as subsequently explained, by conductor 122 of FIGS. 5 and 6A and 6B. A DUART (universal asynchronous receiver-transmitter), which can be implemented by means of a Signetics 2681 integrated circuit, designated by reference numeral 39, is connected to internal bus 38. Conventional RS232 ports 44 and 45 are connected to the A and B inputs of DUART 39. An RS422 interface is connected to port B of DUART 39. These components are readily available from various manufacturers. Also, a read only memory, interrupt circuitry 40 and memory circuitry 41 are connected to internal bus 38. ROM 36 contains identification information and a routine which bootstraps the user program into memory 41 for system processor 18. Internal bus 38 is coupled to local bus 21 (which also includes an address bus, a data bus, and a control bus) by means of local bus interface circuitry 42A, subsequently described with reference to FIGS. 6, 6A and 6B.

The read only memory 36 can be implemented by any of various electrically programmable read only memories that are readily commercially available. Microprocessor 35 can be implemented by means of a two-chip pair consisting of a 16032 and a 16201 microprocessor and timing chip set manufactured by National Semiconductor Corporation. A Motorola 68000 microprocessor could also be used, although the specific program printouts enclosed herewith pertain to the National Semiconductor chip pair.

The local bus interface 42A of system processor 18 has the property that it makes connection only to local bus segments on the right hand side of its edge connector, so it does not "extend" the local bus 24 by the mere act of plugging system processor 18 into an edge connector receiving slot of the above-mentioned mother board.

Figure 3:
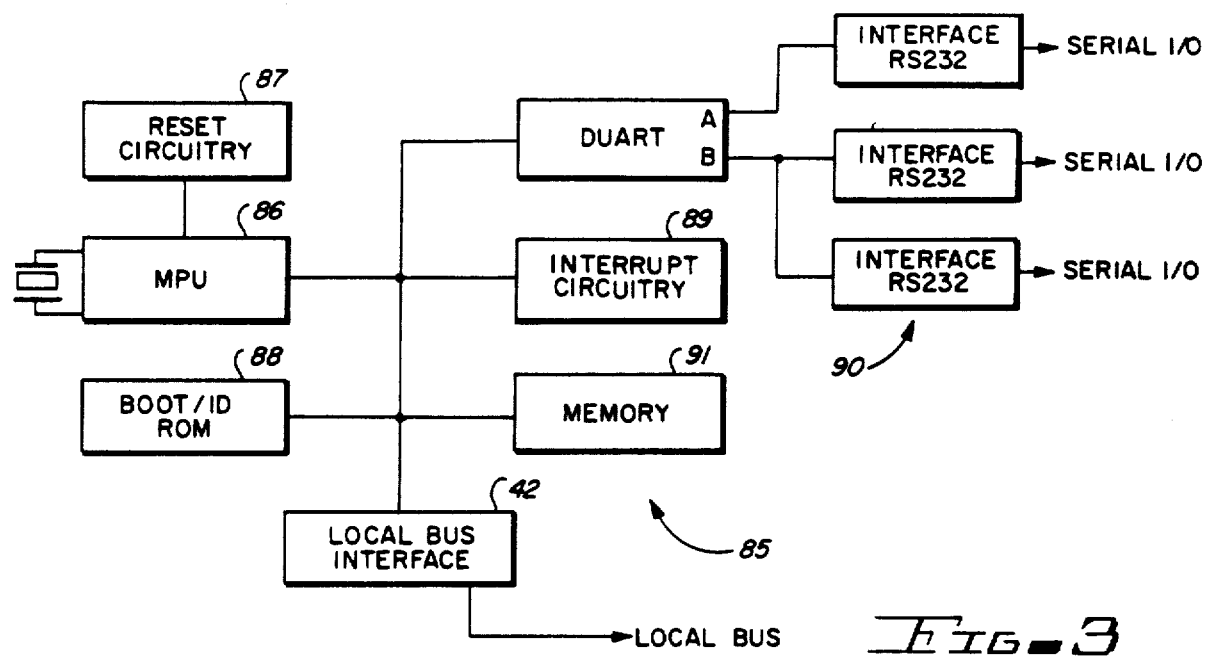
FIG. 3 is a block diagram of a dedicated processor unit that can be used in an alternate embodiment of the invention.
Figure 4:
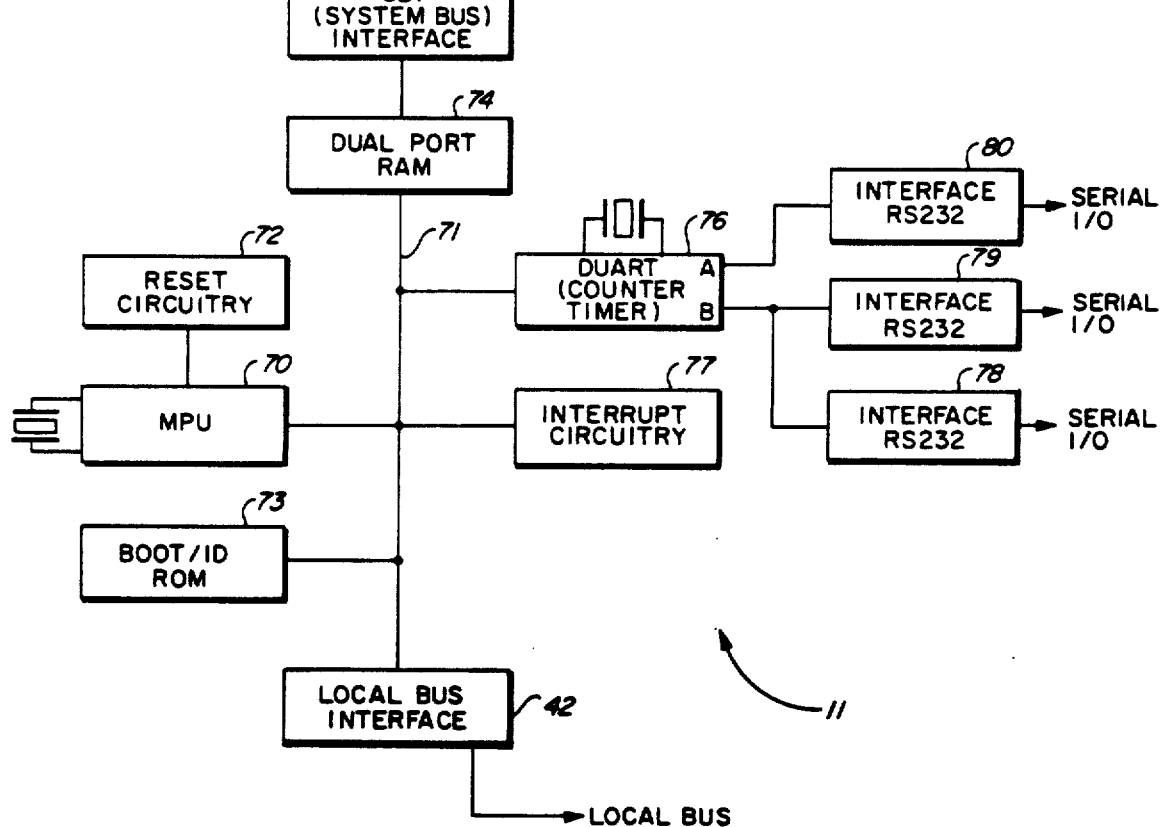
FIG. 4 is a block diagram of a local processor unit (LPU) in a diagram of FIG. 1.

Referring now to FIG. 3, a "dedicated" processor that can be used in one embodiment of the invention is shown, and is designated by reference numeral 85. This dedicated processor is used where only one local processor unit is required, and there is only one local bus in the entire system. In this instance, no system bus 20 is needed, nor is the system processor 18 needed, since there is no multi-processor communication. The dedicated processor unit 85 is similar to the local processor next described with reference to FIG. 4, except that it makes no connection to system bus 20 and therefore needs no system bus interface circuitry 35, nor does it require any dual port RAM 74 (FIG. 4). Instead, a memory 91 that is similar to memory 41 of system processor 18 is connected to internal bus 38. The DUART 88 and the serial communication interface device generaly designated by 90 can be identical to those in the system processor 18 and local processor 11, as can local bus interface circuit 42. Therefore, it will be convenient to now thoroughly describe the block diagram of local processor 11 with reference to FIG. 4.

Referring now to FIG. 4, local processor 11 includes system bus interface circuitry 75, which includes a plurality of suitable buffer circuits that connect the individual conductors of system bus 20 to one port of dual port RAM 74. Dual port RAM 74 includes an Intel 8206 and 8207 chip set, which includes a dynamic RAM controller and an error correction chip. It also includes a plurality of 64K by 1 dynamic RAMs that are readily available from Intel and others. The second port of dual port RAM 74 is connected to bus 71. As before, the system bus 20 and the internal bus 71 each include a bi-directional data bus, an address bus, and a control bus including interrupt and acknowledge lines. Internal bus 71 is connected to microprocessor 70, an identification ROM 73 which also includes a bootstrap subroutine, interrupt circuitry 77, and and DUART 76. Ports A and B of DUART 76 are connected to conventional serial I/O circuits, as previously described with reference to FIG. 2. Internal bus 72 is also connected to local bus interface circuit 42 and includes a plurality of jumper conductors 62 corresponding to each conductor of each of the local bus segments of local bus 21. The details of local bus interface circuit 42 are described thoroughly with reference to FIG. 5.

It should be noted that the lower port of dual port RAM 74 has priority over the upper port, which is coupled to the system bus 20, because the task being executed by microprocessor 70 (which is identical to microprocessor 35 in FIG. 2) is usually a real time task which cannot be interrupted (for example, in a machine control or process control application), unless permission for the interrupt is given by microprocessor 70 of local processor 11.

Referring now to FIG. 5, the circuitry in a typical interface circuit, designated by reference numeral 120, is shown. This circuit could be any of the interface circuits such as 12, 13, 15, 17 of FIG. 1. Interface board 120 includes base address register 121, which has its data inputs connected to data bus 21D, which has 16 conductors. The reset input R of base address register 121 (which is implemented by means of 274LS175 quad D type integrated circuits, has its reset input connected to "power on reset" conductor 122. Power on reset conductor 122 can be considered to be a conductor of system bus 120 and goes to a logical "1" level when the system 10 (FIG. 1) is "powered up", i.e., when the power is turned on.

The outputs of base address register 121 are respectively connected to one set of inputs of an 8-bit digital comparator, which is implemented by means of a 74LS688 integrated circuit, and also are connected to the inputs of a 8-bit interrupt vector buffer 124, which can be implemented by means of any ordinary buffer circuits. The outputs of interrupt buffer 124 are connected to respective conductors of data bus 21D.

A set of inputs of comparator 123 are also connected to the respective eight conductors of data bus 21D. When a "1" level is applied on conductor 125 to the enable input of comparator 123, and the address on address bus 21A matches that stored in address bus 121, a "1" level called BEN (Board Enable) is produced on conductor 126; this signal enables an address decoder 127. Address decoder 127 is implemented by a 74LS138 3-to-8 line decoder/demultiplexer integrated circuit, and has as its address inputs the four most significant bits of address bus 21A. The eight outputs of decoder 127 are generally designated by reference number 128, some of which go to a block of circuitry designated by reference numer 129. Block 129 represents the main functional part of interface circuit 120, and performs various analog and/or digital interfacing functions to couple peripheral devices into data network 70. This function is not per se part of the invention, and so its details are not set forth. One of the address decoder outputs 128A is connected to an enable input of identification ROM 130, which contains information indicating the type of interface circuitry block 129 contains, and how much memory space or I/O (input/output) address space must be allocated to interface circuit 120.

One output 128B of address decoder 127 is fed back to the clock input of base address register 121. An "initialization" flip flop 131 has its D input connected to the D0 conductor 21B-0 conductor of local data bus 21D. This D0 conductor of local data bus 21B is also connected to the D-input of interrupt flip-flop 132. The clock input of initialization flip-flop 131 is connected to conductor 128C, which conducts a signal SEL1 produced by address decoder 127. The clock input of interrupt flip-flop 132 is connected to conductor 128D, which conducts the SEL2 output produced by address decoder 127. The reset input of flip-flop 131 is connected to power on reset conductor 122. The set input of flip-flop 131 is grounded, and the set input of interrupt flip-flop 132 is connected to the board interrupt signal on conductor 133.

The Q output of initialization flip-flop 131 is connected to one input of three input AND gate 134. Another input of AND gate 134 is connected to conductor 135, which conducts the interrupt acknowledge signal IAKIN (interrupt acknowledge input) produced by microprocessor 72 of local processor 11. Conductor 135 is also connected to the one input of two input OR gate 138. The third input of AND gate 134 is connected to the Q output of interrupt flip flop 132. Incidentally, flip flops 131 and 132 are implented by means of 74LS74D type integrated circuit flip-flops.

Conductor 135 is also connected to one input of two input AND gate 137. Its other input is connected to the Q output of flip flop 132. The output of three input AND gate 134 is connected to conductor 135A, which conducts the signal IAKOUT (interrupt acknowledge output) which is transmitted on to the next adjacent interface circuit in a "daisy chain" fashion. Conductor 135 is connected to one input of two input OR gate 138. The second input of OR gate 138 is connected to the Q output of flip flop 131. The output of AND gate 137 is connected to conductor 139, which conducts an enable signal to the enable input of interrupt vector buffer circuit 124. IAKIN conductor 135 is also connected to the D input of a flip-flop 132B, the Q output of which is connected to the reset input of interrupt flip-flop 132. The clock input of flip-flop 132B is connected to address strobe (ADS) conductor 132C. The reset input of flip-flop is connected to power on reset conductor 122.

The board interrupt signal on conductor 133 is generated by circuit 129, and is latched into interrupt flip flop 132. The Q output of interrupt flip flop 132 is coupled to the base of grounded emitter NPN transistor 141, the collector of which is connected in a wired OR fashion to system interrupt (SPU interrupt) conductor 21D. Reference numeral 226A designates a pull-up resistor that is located inside of local processor unit 11 of FIG. 4.

Before explaining in detail the operation of the circuitry in interrupt card 120 (exclusive of the functional interface circuitry in block 129) it will be helpful to realize that a "board generated" interrupt signal sets interrupt flip flop 132. One other thing that this does is that it causes the interrupt vector that has been written into interface board 120 (and, in this case, is identical to the assigned address written into base address register 121) to be gated onto local data bus 21D so that an interrupt service routine in local processor 11 (FIG. 4) can select the needed interrupt routine to service the particular interrupt generated by interface board 120. The occurrence of a board interrupt signal being generated by interface circuitry 129 also prevents the interrupt acknowledge signal IAKIN from being propagated to the next interface card connected to local bus 21.

Finally, the occurrence of an interrupt signal produced on conductor 133 by interface circuitry 29 results in turning transistor 141 on, thereby, pulling down interrupt conductor 21D of local bus 21 (FIG. 4), and applying a "1" signal to the interrupt input of microprocessor 70 (FIG. 4).

It will also be helpful to realize that at the beginning of the initialization procedure, initialization flip flop 31 is reset. In this condition, the combination of a "0" stored in initialization flip flop 131 and a "1" value of IAKIN on conductor 135 will cause a logical "1" to appear on conductor 125 at the enable input of comparator 123. This allows interface board 120 to respond to the initial value of all "1"s initially preset into base address register 121 in response to the power on reset circuit signal on conductor 122.

The same result will be achieved as soon as initialization flip flop 131 is set by a true signal on D0 conductor 21B-0, which is done at the end of the initialization process by local processor 11.

If interrupt flip flop 132 is latched by a board generated interrupt, and IAKIN is a logical "1", the logical "1" produced on conductor 139 by AND gate 137 will enable the interrupt vector stored in base address register 121 to be gated onto local data bus 21B, as previously mentioned.

During the initialization process, when an enable signal is present on conductor 125 to the enable input of comparator 123 and the initial preset address state is contained in base address register 121 and that same number is being asserted by local processor 11 on address bus 21A, address decoder 127 is caused to generate a select signal on conductor 128A, causing the contents of identification ROM 128A to be output onto data bus 21B. Local processor 11 uses this information to assign an appropriate address to interface board 120, and outputs that address via data bus 21B and loads it into base address register 121 of interface board 120. Then, initialization flip flop 131 is set, and thereafter interface board 120 can respond only if the assigned address now stored in base address register 121 is asserted on local address bus 21A by local processor unit 11.

Referring now to FIG. 6, this block diagram shows in more detail the system bus interface 75, local bus interface 42, dual port RAM 74, and interrupt circuitry 77 in the local processor 11 shown in FIG. 4, and shows the system processor 18 as a single block. It should be noted that the system bus interface circuitry 43 (FIG. 2) of system processor 18 is relatively simple, and can consist simply of suitable unidirectional and bi-directional buffers, and that the interrupt circuitry 40 of system processor 18 is essentially identical to interrupt circuitry 77 of local processor 4.

Referring still to FIG. 6, it can be seen that system bus 20 includes system address bus 20A, system data bus 20B, system control bus 20C, and interrupt conductor 20D. Similarly, local bus 21 includes local address bus 21A, local data bus 21B, local control bus 21C, and local interrupt conductor 205. For convenience, the simple buffer circuitry included in system bus interface 43 is not shown in system processor 18, nor is the simple buffer circuitry in system bus interface circuitry 75 of local processor 11. Dual port RAM 74 is shown in its two parts 74A and 74B in FIG. 6. Port 74A is an Intel 8207 dynamic RAM controller, and block 74B constitutes Intel dynamic RAMs. The system address bus 20A is multiplexed into the address inputs of dual port RAM controller 74A by means of multiplexer 148, which can be implemented by a means of 74LS244 integrated circuit multiplexers. Similarly, the address conductors of local address bus 21A are multiplexed into the address inputs of dynamic RAM controller 74A by multiplexer 148. Control conductor 149 conducts a control signal generated by dynamic RAM controller 74 to control which one of system address bus 20A or local address bus 21A is multiplexed by conductors 200 to the address inputs of dynamic RAM controller 74A. Appropriate conductors of system control bus 20C are connected to the upper control port of dynamic RAM controller 74A. Appropriate conductors of local control bus 21C are connected to the lower control port of dynamic RAM controller 74A. The control outputs of dynamic RAM controller 74A are connected by bus 201 to the address inputs of dynamic RAM 74B.

The system data bus 20B is coupled by multiplexer 153 to the "data in" inputs of dynamic RAM 74B, and the local data bus 24B is also multiplexed by multiplexer 153 into the "data in" terminals of dynamic RAM 74B. Which one of the system data bus 20B and local data bus is multiplexed into the data inputs of dynamic RAM 74B is controlled by a select signal generated on conductor 152 by dynamic RAM controller 74A. The "data out" terminals of dynamic RAM 74B are multiplexed by means of multiplexer 150 onto the one of system data bus 20B and local data bus 21B that is selected by a control signal on condutor 151 generated by dynamic RAM controller 74A.

Address decoder 202 has a control input connected to an appropriate conductor of system control bus 20C and several address inputs connected to system address bus 20A. Address decoder 202 generates an enable input ENS connected to the upper port of dynamic RAM controller 74A, and similarly, address decoder 203 has a select line connected to local control bus 21C and a plurality of address inputs connected to local address bus 21A and generates an enable output ENL which is connected to the enable input of a lower port of dynamic RAM controller 74A.

Identification ROM 230, which can be implemented by means of an electrically eraseable SY2802G read only memory manufactured by Synertek, is selected by means of conductor 227 which is generated by address decoder 203. Certain conductors of local control bus 21C are connected to control inputs of identification ROM 230. Local data bus 21B is connected to the data terminals of identification ROM 230, and several conductors of local control bus 21C are connected to control inputs of identification ROM 230. Several appropriate address conductors of local address bus 21A are connected to address inputs of identification ROM 230 by means of conductors 228.

Interrupt circuitry 77 has control inputs connected to local control bus 21C. Interrupt circuitry 77 also has a select input connected by conductor 207 to an output of address decoder 203. Interrupt circuitry 77 has an interrupt output connected to SPU interrupt conductor 21D. Interrupt circuitry 77 also receives signals from system bus 20, and generates an interrupt output signal on LPU interrupt conductor 20D of system bus 20. Interrupt circuitry 77 receives a select signal generated by address decoder 202 via conductor 204. It has an input connected to the D0 conductor of system data bus 20B. Interrupt circuitry 77 also generates an interrupt acknowledge signal on conductor 135.

Figure 6B:
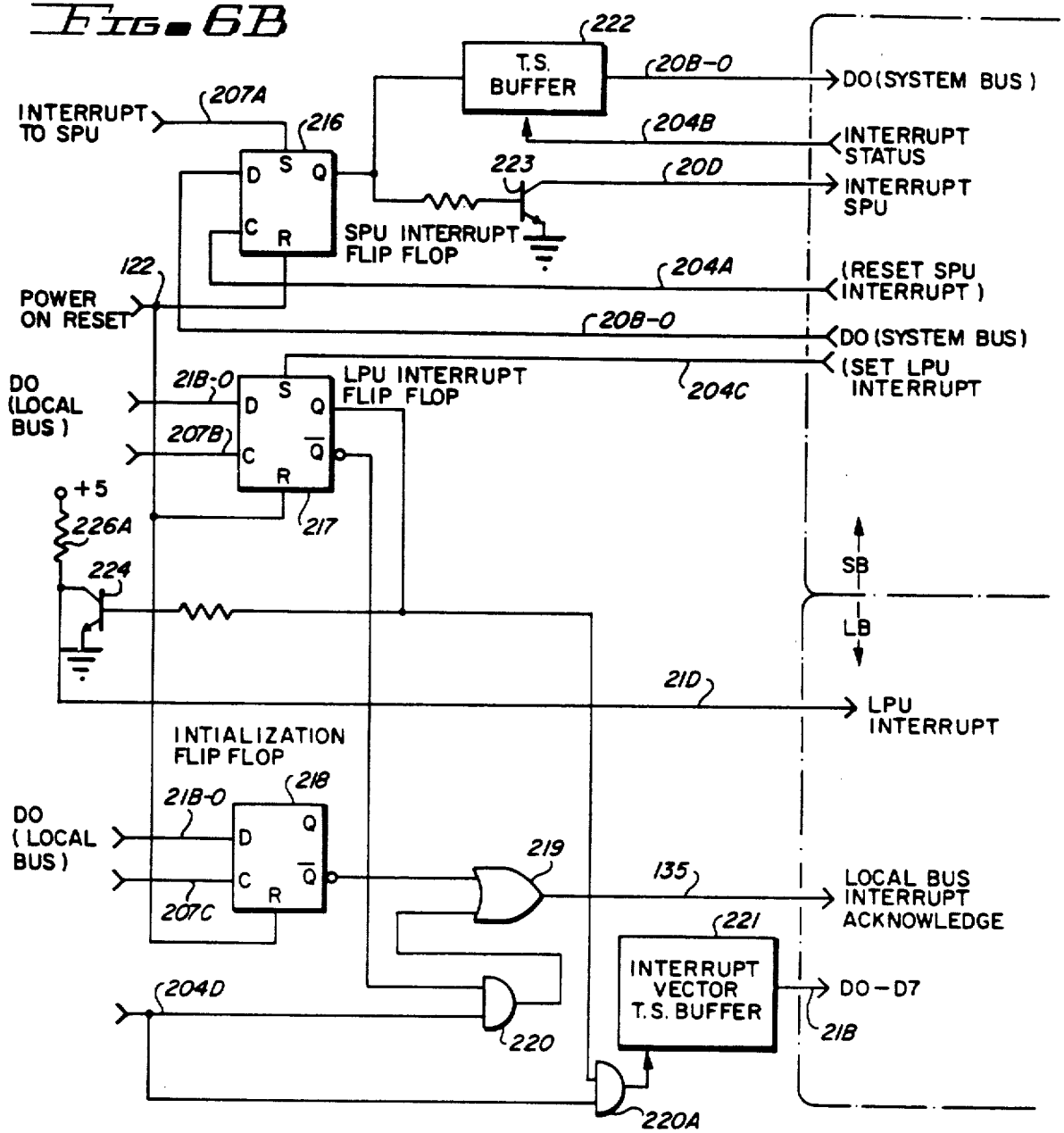
FIG. 6B is a detailed block diagram of the interrupt circuit in FIG. 6.
Figure 6A:
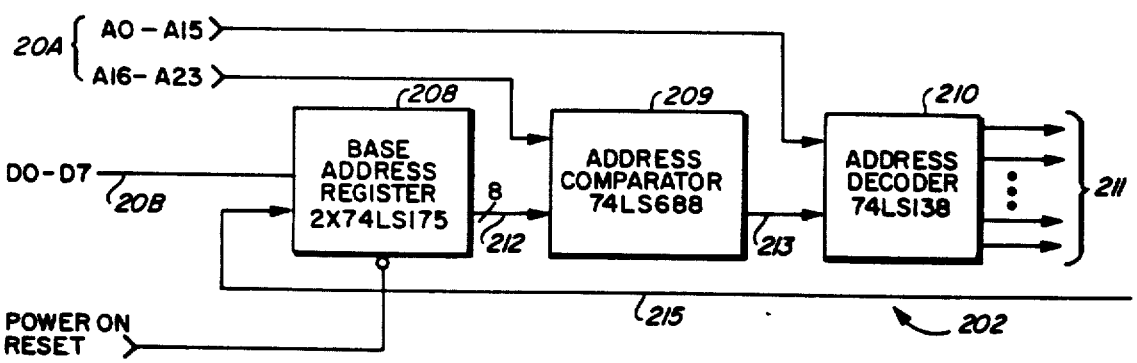
FIG. 6A is a detailed block diagram of one of the address decode circuits in FIG. 6.

Referring now to FIG. 6A, each of address decoders 202 and 203 of FIG. 6 has the configuration shown in FIG. 6A, although only address decoder 202 is shown. It includes base address register 208, which is implemented by means of 74LS275 integrated circuit latches. It has a reset input connected to power on reset conductor 122, which sets all "1"s in base address register 208 when the self configuring system 10 of FIG. 1 is powered up. Its inputs are connected to the D0 through D7 lines of system address bus 20B.

Base address register 208 has 8 outputs 212 which are connected to one set of digital inputs of digital address comparator 209, corresponding to inputs of the A1-6–A23 conductors of system address bus 20A. Address comparator 209 is implemented by means of 74LS688 digital comparators, and produces a BEN (board enable) output signal on conductor 213, which is connected to an enable input of address decoder 210. Address decoder 210 is a 747S138 integrated circuit three-to-eight line decoder/de-multiplexer. The address inputs of address decoder 210 are connected to A0–A15 address conductors of system address bus 20A. The various outputs of address decoder 210 are designated by reference numeral 211, and are routed to enable various functions shown in FIG. 6, but are not shown in detail because one skilled in the art could readily provide these connections to the enable inputs of the various circuits shown in FIG. 6. One of the outputs 211 is designated by reference numeral 215 and is fed back to an enable input of base address register 208 to allow an assigned address to be loaded into base address register 208. Conductors 227 and 207 of FIG. 6 are examples of other outputs of address decoder 203; the output ENL, conductors 204, and ENS are included among the outputs of outputs of address decoder 202. The only difference between SPU address decoder 202 and LPU address decoder 203 is that the latter is connected to local bus 21, rather than system bus 20.

Referring now to FIG. 6B, details of interrupt circuitry 77 are shown. Interrupt circuitry 77 includes three flip flops, namely, SPU interrupt flip-flop 216, initialization flip-flop 217 and LPU interrupt flip flop 218, each of which is a clocked D-type flip flop having set and reset inputs. SPU interrupt flip flop 216 performs the function of being set when a local processor interrupts the system processor by "pulling down" SPU interrupt conductor 20D, and has one of address decoder outputs 207, (FIG. 6), designated by reference numeral 207A, connected to its set input. Its reset input is connected to power on reset conductor 122, mentioned previously, as are the reset inputs of flip flops 217, and 218. The clock input of SPU interrupt flip-flop 216 is connected to conductor 204A, which also is one of the conductors 204 produced by LPU address decoder 202 in FIG. 6. The signal on conductor 204A can be referred to as a "reset SPU interrupt" input and performs the function of allowing the system processor to clear SPU interrupt flip-flop 216 with a "0" conductor 20B-0 system data bus 20B. The Q output of SPU interrupt flip-flop 216 is coupled by means of a current limiting resistor to the base of grounded emitter NPN transistor 223, the collector of which is connected to the SPU interrupt conductor 20D. The Q output of SPU interrupt flip-flop 216 is connected to three-state buffer circuitry 222, one input of which is connected to conductor 204B, which is one of the decoder outputs of SPU address decoder 202. Buffer 222 produces the D0(SYSTEM BUS) signal on the D0 conductor 20B-0 of system data bus 20B.

Flip-flop 217 is referred to as the "LPU interrupt" flip-flop. Its D input is connected to the D0 conductor 21B-0 of local data bus 21B and conducts the signal D0(LOCAL BUS). Its clock input is connected to conductor 207B which is one of the address interrupt decoder outputs of address decoder 203, (FIG. 6) and conductors a signal which in conjunction with D0(LOCAL BUS), enables clearing of the LPU interrupt flip-flop 217. The set input of LPU interrupt flip-flop 217 is set by an SPU address decoder output signal conducted on conductor 204C which is one of the conductors of bus 204 shown in FIG. 6. The Q output of LPU interrupt flip-flop 217 is coupled to the base of grounded emitter NPN transistor 224, the collector of which is connected to the local processor interrupt line 21D.

Note that resistor 226A is an external "pull up" resistor which allows wired OR connection of the collectors of the NPN transistor 224 and each of the transistors 141 of each interface board 120 (FIG. 5). The Q output of LPU interrupt flip-flop 217 is connected to one input of two input AND gate 220, subsequently described. The Q output of flip-flop 217 is also connected to one input of two input AND gate 220, the output of which enables interrupt vector three-state buffer 221.

The D input of initialization flip-flop 218 is connected to the D0 conductor 21B-0 of local data bus 21B. The clock input is connected to output conductor 207C of LPU address decoder 203 and performs the function of setting or resetting the initialization flip-flop 218 in conjunction with the D0(LOCAL BUS) signal. The Q output of initialization flip flop 218 is connected to one input of two input OR gate 219.

The second input of two input AND gate 220 is connected to conductor 207D which is another one of the outputs of LPU address decoder 203 and conducts an interrupt acknowledge signal generated by the local processor 11. The output of two input AND gate 220 is connected to the other input of two input OR gate 219. The output of OR gate 219 is connected to conductor 135, which generates the local bus interrupt acknowledge signal which is passed on as an output to the nearest interface circuit (which is connected to the mother board slot adjacent to local processor 11).

The decoded interrupt acknowledge signal on conductor 207D is also connected to an input of 2-input AND gate 220A, which enables interrupt vector three state buffer 221, to output the interrupt vector stored in buffer 221 on the D0 through D7 conductors of local data bus 21B.

Now that the structure of the circuitry in FIGS. 6, 6A and 6B have been described, its operation will be explained. The circuitry shown in FIGS. 6, 6A and 6B enables each local processor to initially set the contents of its base address register to all "1"s in response to the power on reset signal and then recognize as initial address consisting of all "1's" output by the system processor 18. When the system processor 18 then outputs a particular serial number in accordance with the initialization routine disclosed in FIG. 10, the message with that serial number is loaded into the upper port of the dual port memory 74B of each of the local processors. Each of the local processors then reads that serial number and compare it with its own serial number, which is internally stored in and fetched from its own identification ROM 230. If there is a match, that local processor generates an "acknowledge" signal, in accordance with the procedure described with reference to FIG. 10, and if the serial number of that local processor meets the condition specified by the system processor in its message, the called for action is taken (either by sending an acknowledge signal, or setting the contents of its base address register 208 (FIG. 6A) equal to an assigned address output on the system data bus 20B by the system's processor, or terminating if an address has already been assigned to that local processor).

FIG. 6 shows how the local processor interfaces with the two buses (system bus 20 and local bus 21) to which it is connected. Communication between the system bus 20 and the local bus 21 takes place through dual port RAM 74, which has the two portions designated by 74A and 74B in FIG. 6. This prevents the CPU 70 of the local processor from having to interfere with execution of real time user processes in order to communicate with the system processor 18. The dual port RAM 74 in effect functions as a repository for messages from the system processor 18, which then can be acted upon by the microprocessor 70 of local processor 11 whenever it has time. The dual port dynamic RAM controller 74A performs the function of determining which of three things gets control of the dynamic RAM storage section 74B at a particular time. These three things are, of course, the system bus 20, the local bus 21, and also a built-in function in the dual port dynamic RAM controller which automatically refreshes the dynamic random access memory portion 74B.

The outputs on conductor 200 of the multiplexer 148 occurring in response to the select signal on conductor 149 generated by dual port dynamic RAM controller 74A are processed by dual port RAM controller 74A and then output onto bus 201 to the address inputs of dynamic RAM section 74B. As mentioned above, multiplexers 150 and 153, in response to select signals 152 and 151, route information to or from the desired system data bus or local data bus during a read operation or a write operation. The 74LS625 multiplexers are bi-directional multiplexers, whereas the 74LS244 multiplexer 148 is not bi-directional. Address decoders 202 and 203 each receive address and timing information from the respective control and address buses to generate the needed timing, address enable, and read or write command signals to thereby select the appropriate multiplexers for a read or write operation.

Thus, it is seen that the dual port dynamic RAM is a place where messages that are sent by either the system processor or the local processor can reside. There, low priority messages can be stored in mutually acceptable locations that are the same for all local processors.

Interrupt circuitry 77 provides the capability for processing high priority messages. It reduces the amount of time that is needed to service a high priority message, and also handles interrupts that are generated on the local bus by the peripherals. The interrupt circuitry 77 has three sets of inputs from each bus. On the system bus side there is a D0 line 206 from the system data bus 20B. It is used to set and reset internal flip flops in interrupt circuitry 77. There is also the interrupt line 20D for the system bus that conducts interrupts generated by interrupt circuitry 77 to interrupt system processor 18. The three conductors 204 conduct signals from SPU address decoder 202 into interrupt circuitry 77 to control various flip flops therein.

From the local bus side of interrupt circuitry 77, four conductors designated by 207 conduct signals from address decoder 203 to control internal flip flops in interrupt circuitry 77. The interrupt line 21D conducts interrupts from interrupt circuitry 77 to microprocessor 70 of the local processor. In this case, eight of the data lines from local data bus 21B are utilized, rather than only the D0 line. Finally, interrupt circuitry 77 generates an interrupt acknowledge IACK signal on conductor 135, which is part of the local bus 21.

Next, the details of interrupt circuitry 77 are described with reference to FIG. 6B. This circuit has the capability of allowing each processor to interrupt the other processor.

The local processor can interrupt the system processor to indicate that it has already placed a message in the dual port RAM 74B and which now is ready to be received by system processor 18. The SPU decoder interrupt signal will be produced by the local processor on LPU address decoder output conductor 207A. This signal sets SPU interrupt flip flop 216. This turns on transistor 223, which pulls down SPU interrupt line 20D to interrupt system processor 18.

Once the SPU interrupt signal has been received on conductor 20D by the system processor 18, it will read the message stored in the dual port RAM 74 by polling all of the dual port dynamic RAMS of the various local processors connected to system bus 20. Aternately, this can be done by causing the system processor to generate a signal on conductor 204B which activates a three state buffer 222 that causes the state in SPU interrupt flip flop 216 to be output on the D0 conductor 20B-0 of system data bus 20B.

Once the system processor has found out from which local processor the last interrupt came and has processed it, the system processor that can clear the interrupt by means of a signal applied to conductor 204A which is output by SPU address decoder 202. This signal, in combination with the signal of the D0 conductor 20B-0 of system data bus 20B applied to the input of SPU interrupt flip flop 216, then causes it to be reset.

The above-described operation for generating an interrupt from the local processor to the system processor can be carried out "in reverse", wherein the system processor interrupts the local processor. LPU interrupt flip flop 217 is, in this case, set by a "set LPU interrupt" signal on conductor 204C output by SPU address decoder 202. When this happens, the Q output of flip flop 217 turns on transistor 224, which generates an LPU interrupt signal on LPU interrupt bus 21D. Note that other interface devices can also pull local precessor interrupt line 21D low, so the subject local processor has to next determine the source of the present interrupt.

The local processor next generates an interrupt acknowledge signal. This signal is generated on conductor 207B, which is output by LPU address decoder 203. More specially, to reset the LPU interrupt flip flop 217, the local processor will write output information that causes LPU address decoder 203 to generate an output on conductor 207B to the clock input of LPU interrupt flip flop 217. Local microprocessor 70 will simultaneously put a "0" on the D0 conductor 21B-0 of local data bus 21B to cause this clear operation.

During initialization, (subsequently described in more detail with reference to FIGS. 8, 9 and 10) the interrupt "acknowledge" line 135 is being used in a different way as a grant line, or as an authorization line for a particular board to respond to the initialization process. When initialization flip flop 218 is set, its Q output causes the interrupt acknowledge line 135 to be continually high. At the end of the initialization process, the local processor clears the initialization flip flop 218. It does this by outputting a "1" on the D0 conductor of the local bus line 21B and also activating the LPU address decoder 203 which, in turn, outputs a "1" on the address decoder output line 207C.

During the initialization process, the system processor 18 begins by outputting, in accordance with the level 1A initialization scheme of FIG. 9, various possible valid serial numbers. Each serial number is loaded into an appropriate location of each dual port RAM of each local processor connected to system bus 20. Each local processor contains instructions stored in its read only memory to cause it to read the unique serial number stored in identification ROM 230, and read the above-mentioned location of that local processor's dual port RAM to determine which serial number was most recently outputted by the system processor 18. Each instruction loaded into the dual port RAM by system processor 18 contains not only a posible valid local processor serial number, but also a condition and a requested action to be taken by the local processor if that condition is met. Briefly, each local processor compares the serial number that it read from its own identification ROM 230 with the serial number that was contained in the message most recently written by the system processor into the above-mentioned location in dual port RAM 74 and then performs the requested action, depending on whether or not the condition was met. If the condition was met, the local processor generates an interrupt by means of interrupt circuitry 77. This interrupt signal is sent through LPU interrupt line 20D to system processor 18. If the system processor 18 determines, on the basis of the acknowledge signal sent back in the form of an interrupt to the system processor 18, that there has been a match between the serial number that it last output and the serial number stored in one of the local processors, then that system processor 18 outputs a unique address to be assigned to that local processor and stores it along with a requested action (on the condition that there is a match) in the dual port RAM. The requested action is to write the address to be assigned into the base address register 208 (FIG. 6A), if the information output by the system processor in this case causes the address decoder 210 of FIG. 6A to produce a select signal on conductor 215 that enables the assigned address just output by the system processor 18 on conductors D0-D7 of data bus 20B to be permanently loaded into base address register 208.

Figure 7A:
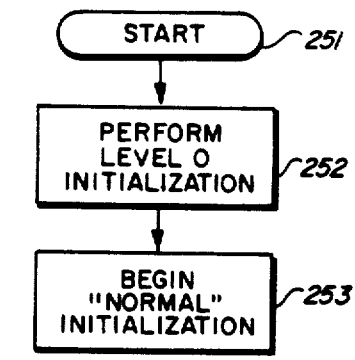
FIGS. 7A–7F constitute a program flow chart of the start up procedures for the processors in FIG. 1.
Figure 7C:
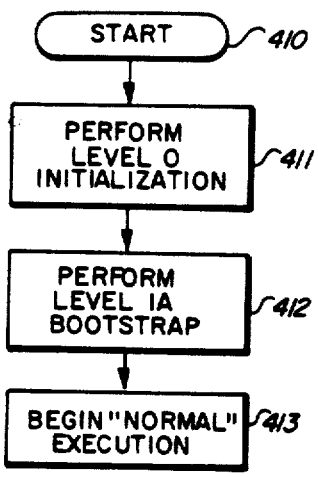
Figure 7E:
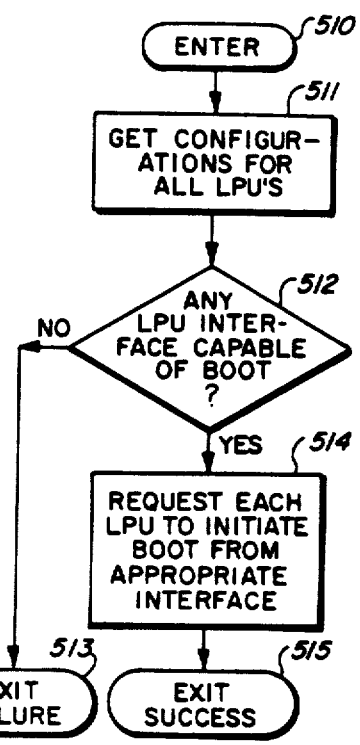
Figure 7B:
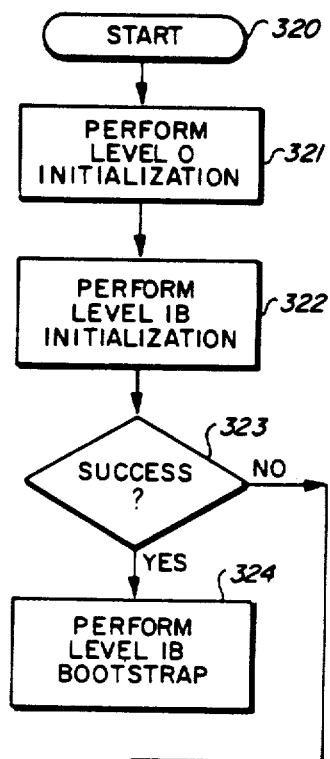

FIGS. 7A, 7B, and 7C disclose flow charts for the basic "start up" procedure for the dedicated processor unit of FIG. 3, the local processor of FIG. 4, and the system processor of FIG. 2 respectively. In the course of carrying out these start up procedures, additional routines, including the "level 0" bootstrap routine of FIG. 7B, the "level 1A" bootstrap of FIG. 7E, and the "level 1B" boostrap routine of FIG. 7F, and also the "level 0", "level 1A", and "level 1B" initialization routines of FIGS. 8, 9 and 10, respectively, are utilized.

The start-up routine for the dedicated processor of FIG. 3 is quite simple, and only will be briefly described. It is entered at label 251 of FIG. 7A and immediately enters block 252 to perform the level 0 initialization procedure, in which the dedicated processor automatically assigns addresses to each of the interfaces that are connected to the local bus to which the dedicated processor is also connected. This routine is described in detail with reference to FIG. 8. The dedicated processor start up routine then goes to block 253 and begins normal execution of programs that are contained in its read only memory.

The local processor start up routine of FIG. 7B is entered at label 320. The first operation performed, as indicated in block 321 is to perform the above-mentioned level 0 initialization routine and assigns unqiue addresses to all of the interfaces such as 12, 13, etc. shown in FIG. 1. Then the local processor start up routine goes to block 322 and performs the level 1B initialization routine of subsequently described in detail with reference to FIG. 9. The level 1B initialization routine enables the local processor to cooperate with the system processor in responding to inquiries by the system processor unit as it attempts to assign unique addresses to all local processors connected to the system bus. The local processor start up routine then goes to decision block 323 and determines if the level 1B initialization procedure is successful in establishing the address of the subject local processor unit. If this determination is affirmative, the routine goes to block 324 and performs the level 1B bootstrap routine of FIG. 7F, subsequently described. If a determination of decision block 323 is negative, the routine goes to block 325 and performs the level 0 bootstrap routine of FIG. 7D and then goes to label 326 and halts.

Referring next to FIG. 7C, the system processor start up routine is entered at label 410, and as indicated in block 411, performs the above-mentioned level 0 initialization routine to assign unique addresses to any interfaces that might be connected to the local bus of the system processor. The program then goes to block 412 and performs the level 1A bootstrap routine of FIG. 7E, subsequently described. The routine then goes to block 413 and begins normal execution of routines that are necessary to its function as a "communications controller" in effectuating message passing between programs or "processes" that reside in different local processors that are connected to the system bus 20.

Figure 7D:
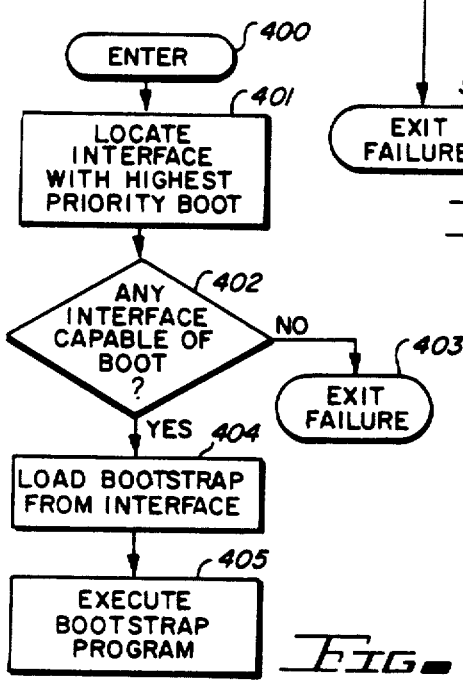

Referring now to FIG. 7D, the above-mentioned level 0 bootstrap routine is entered at label 400, and goes first to block 401. In block 401, the level 0 bootstrap routine locates the interface board having the highest priority bootstrap which is responsible for loading code that is needed from that interface board. Each interface device coupled to a local processor has what is called a "boot priority" associated with it that identifies whether that interface board provides a bootstrap capability. For example, one peripheral device that might be connected to a particular interface board might be a drive disk unit while another interface board might be connected to a synchronous device.

The level 0 bootstrap routine then goes to decision block 402 and determines if any interface board connected to the local processor is capable of boostraping code into the system. If not, the routine exits at label 403. If a determination of decision block 402 is affirmative, the routine goes to block 404 and loads the bootstrap from the interface having the highest priority bootstrap capability. The routine then goes on to block 405 and executes the loaded bootstrap program. If the routine exits via label 403, it returns to the local processor start up routine of FIG. 7B.

Referring now to FIG. 7E, the level 0 bootstrap routine mentioned above is entered via label 510 and goes to block 511. In block 511, the routine, which is executed by the system processor performs essentially the same function for the system 10 of FIG. 1 on a system-wide basis as the level 0 bootstrap routine of FIG. 7D performs for a single local processor. In block 522 the level 1A bootstrap routine obtains the configurations for all local processors connected to the system bus. Next, the level 1A bootstrap routine goes to decision block 512 and determines if any interface board connected to any local processor is capable of bootstraping. If not, the routine exits via label 513, since there is no place for the system to obtain a user program. If a determination of decision 512 is affirmative, the routine goes to block 514 and requests each local procesor to initiate bootstrap operation from its interface having highest bootstrap priority. All other local processors would be instructed to bootstrap from their dual port RAMs.

Figure 7F:
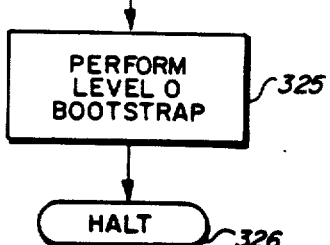

Referring now to FIG. 7F, the level 1B bootstrap routine mentioned above is entered at label 520 and goes to block 521. In block 521, it causes the local processor executing this routine to give the system processor the "configuration" referred to in block 511 of FIG. 7E, and then goes to block 522. In block 522, the level 1B bootstrap routine loads the botstrap routine from the selected interface board, as indicated in block 523. The program then goes to block 524 and executes the loaded bootstrap program.

The "Initialization" procedures executed by self configuring system 10 are described with reference to the flow charts of FIGS. 8, 9, and 10. FIG. 8 is a flow chart of the "level 0" initialization procedure which is executed by all processors to automatically assign unique addresses to all interface boards that are connected to local buses that are connected to the respective processors when power is applied to the system. This level 0 initialization procedure is the first thing any processor does when power is applied. This procedure is entered at start label 100 of FIG. 8. First, in block 101, this initialization procedure simply sets a variable INITIA to the maximum address number permitted, which is 127 in the example described. Then, a variable MAXIA is set to that maximum value and another constant MINIA is set to 0. Recall that when power is applied to the system, all of the interface boards 12, 13, etc. automatically reset the contents of their base address registers to all "1"s, i.e., to 127. Next, in block 102, the level 0 initialization routine sets two variables AVMAX and AVMIN to the values of MAXIA and MINIA indicated in block 101. The variable AVMAX is the present maximum available interface address. AVMIN is the minimum presently available interface address. AVMAX has an initial value of 127 and AVMIN has an initial value of 0. The routine then goes to decision block 103 and determines if the initial response received on the local bus indicates that there is an interface board which does not yet have an address assigned to it. Recall that before completion of the initialization process, any interface board will respond by transmitting the contents of its identification ROM 30 (FIG. 5) onto the local data bus 21B if a logical "1" is transmitted on the interrupt acknowledge line 135.

If the determination in decision block 103 is that there is no interface board connected (to the local bus) to which an address has not yet been assigned, the routine goes to label 104 and stops. At this point, the level 0 initialization routine can go to another level, such as the level 1B or level 1A initialization procedure subsequently described with reference to FIGS. 9 and 10, if a multi-processor environment as shown in FIG. 1 is being utilized or, if the processor executing the level 0 initialization is functioning as a stand-alone processor, then it can go to a bootstrap routine.

It should be noted that the above variable AVMAX becomes a starting point for assigning input/output interface addresses in decreasing order from 127 and AVMIN is the variable used for assigning memory interface addresses in increasing order from 0. This is desirable in order to keep RAM memory contiguous.

If the determination of decision block 103 is affirmative, then the level 0 initialization routine assigns to a variable REGN a value equal to the maximum amount of memory or I/O address space required for the subject interface card. It should be realized that the entire loop shown in the flow chart of FIG. 8 is repeated until all interface cards connected to the local bus have unique addresses assigned to them. This value of REGN is obtained by reading the contents of the above-mentioned identification ROM 30, which contains information as to the required memory space or I/O address space required for that interface. Next, the routine goes to decision block 106 and determines if there are only memory address space regions required. If this determination is that there are no memory regions, it means that the present interface requires only input/output address space, and enters block 107.

The determination of decision block 103, if affirmative, means that there is an interface device connected at the address 127 being output by the SPU, DPU, or LPU presently executing the level 0 initialization routine. Recall that the IACK signals are initially transmitted by the local processor to the closest interface device, which will respond affirmatively to decision block 103 if it has not had an address assigned to it yet, and will simply pass the IACK signal on to the next interface if its address has been assigned during a previous loop of the level 0 initialization routine.

In block 105, I/O address regions are assigned from the "top down", so in block 107 the I/O address regions are assigned from the top down so the required amount of address space, i.e., REGN, is subtracted from the presently available amount of I/O address space, i.e., from AVMAX. Then, in block 108, the routine sets the interface address to the current value of AVMAX, i.e., loads this value from local data bus 21B into base address register 121 (FIG. 5). The program then returns to decision block 103 and tests the next interface card, which now receives the IACK signal automatically from the previous interface card. In block 108, the routine also sets the initialization flip flop 131 (FIG. 7) by outputting a "1" on the D0 line of the local data bus 21B.

If the determination of decision block 106 is negative, then the present interface board has memory space which must be assigned. The program then sets the value of AVMIN into base address register 121 (FIG. 5) and recomputes a new value of AVMIN equal to the present value plus the amount of memory address space required, i.e., REGN, as indicated in block 110, and sets the initialization flip flop 131 and returns to decision block 103.

Referring now to FIG. 9, a flow chart of the "level 1B" initialization routine is shown. This routine is executed only by local processors such as 11, 14, and 16 of FIG. 1 during the procedure in which the system processor 18 executes a routine to output various valid serial numbers to attempt to match them to the local processors and, on this basis, automatically assigns unique address numbers to all local processors connected to system bus 20. The routine that the system processor 18 concurrently executes is referred to as the "level 1A initialization routine", subsequently described with reference to FIG. 10. The level 1B initialization routine of FIG. 9 is quite simple, because it merely causes each local processor which has not yet been assigned a unique address to receive and test requests output by system processor 18. These requests each consist of a condition and an action to be performed by the receiving local processor, if that condition is satisfied. The condition may be that the serial number of the receiving local processor be less than, greater than, or equal to the number output on the system bus 20. The action specified to be performed if the condition is met is for the local processor to send an acknowledge on the SPU interrupt conductor 20D (FIG. 6) that goes back to the system processor 18, or for the local processor to set its system bus address recognition circuitry to an assigned address value being output on the system bus by the system processor, or to terminate. (See block 122A of FIG. 10).

Still referring to FIG. 9, the level 1B routine goes from start level 140 to decision block 142 and determines if the condition received on the system bus 20 by the local processor executing this routine is met. If it is not, the routine simply loops back on itself until a request condition is satisfied. When the latter occurs, the routine enters block 143 and performs the requested action, which is to acknowledge if a condition specified in the request is met or cause the local processor to set its address to an address being output by the SPU, or to terminate. In decision block 144, the routine returns to decision block 142 unless the action is to terminate.

If the action is to terminate, the routine goes to block 145 and returns to the calling program. Typically, a bootstrap procedure will be executed next.

Figure 10:
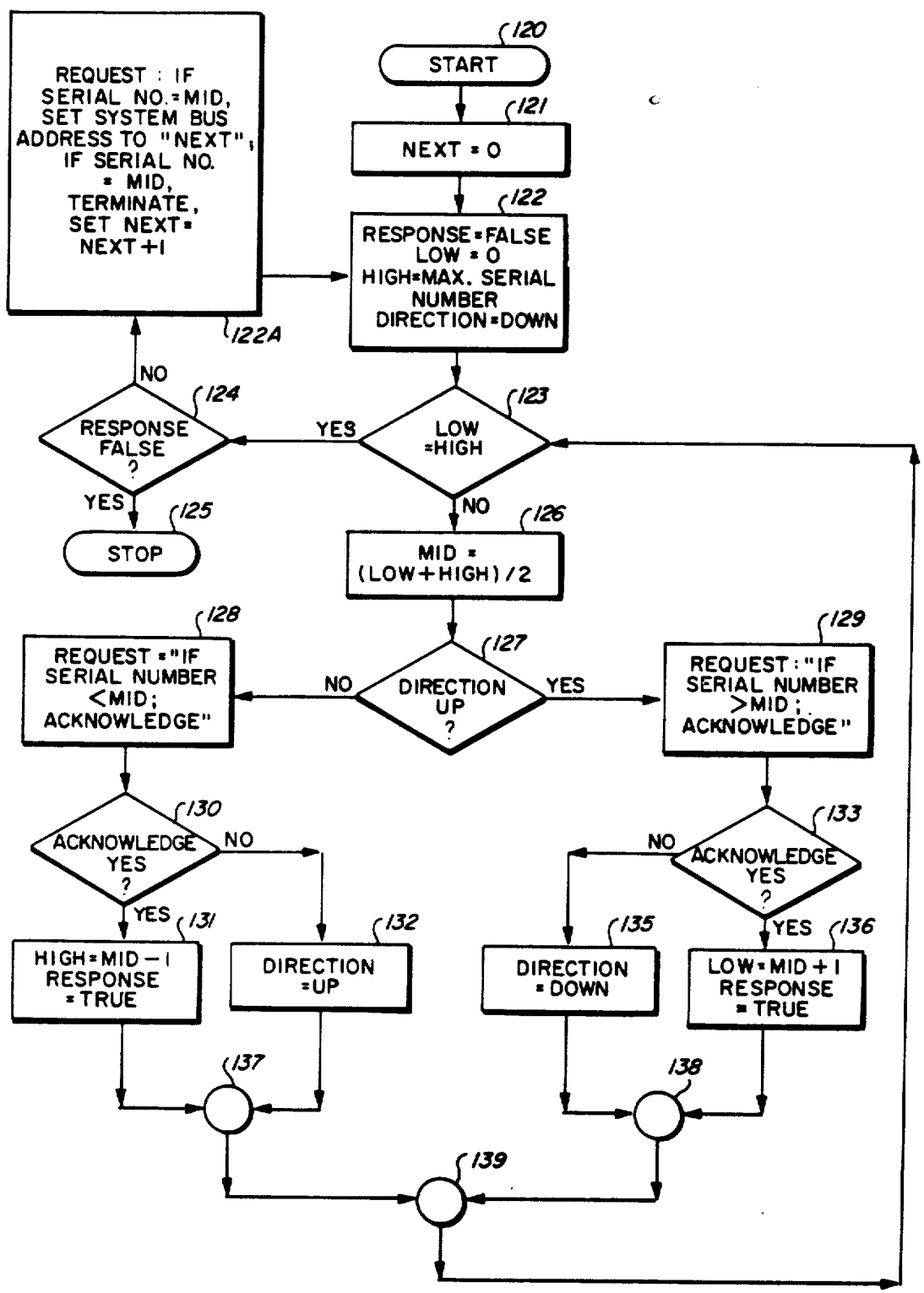
FIG. 10 is a flow chart of an initialization routine in which the system processor of FIG. 1 automatically assigns addresses to the local processors therein.

Referring next to FIG. 10, the "level 1A" initialization routine is shown, wherein the system processor 18 (FIG. 1) executes a procedure to automatically assign addresses to the various local processors connected to system bus 20. Recall that all local processors are manufactured with a unique serial number stored in this identification ROM 230 (FIG. 6). This routine is entered at start label 120. In block 121, it simply sets the value of the variable NEXT to 0. The variable NEXT is the next system address to be assigned to a local processor having the serial number that matches the one last output by system processor 18.

The routine then goes to block 122 and sets several variables. More specifically, it sets a variable RESPONSE to a level that means "false", a variable LOW to 0, a variable "HIGH" to maximum possible serial number, and a variable DIRECTION to a level that means the outputted serial number should be reduced.

The program then goes to decision block 123 and tests to determine if the variable LOW is equal to the variable HIGH. If this condition is not met, and usually it won't be on the first page, the routine goes to block 126, and sets a variable MID to the average value of the variables LOW and HIGH. The variable MID represents the midpoint of the remaining search range. Next, the routine goes to decision block 127 and tests the value of DIRECTION. On the first pass, the direction will be down, and the routine will enter block 128. This causes the system proessor 18 to output the indicated request that if the presently output serial number is less than MID, the receiving local processor is to acknowledge by means of the interrupt conductor 20D (FIG. 6). The program then goes to decision block 130 and tests the level of interrupt conductor 20D. If it indicates acknowledgement by any local processor connected to system bus 20, the routine goes to block 131 and sets the value of HIGH to the quantity MID minus 1, and sets the variable RESPONSE to a level that means "true" and returns via nodes 137 and 139 to decision block 123. If no acknowledge is received in decision block 130, then the routine changes the value of DIRECTION to a value meaning that the serial numbers to be output by system processor 18 should be increased as the search continues.

The foregoing loop will continue to be repeated, computing a new value of MID each time and decrementing HIGH each time until HIGH is equal to LOW and then will go to decision block 124. This will mean that a local processor with its serial number equal to the last one output by the system processor has been found.

If the determination of decision block 124 is affirmative, the routine goes to block 122A and causes system processor 18 to output the request "IF the presently output serial number is equal to MID, then set the value of the system address bus to the present value of NEXT", and also sends the request "IF the present serial number is equal to MID, then terminate," and also sets NEXT=NEXT+1 (to provide the next address number to be assigned). This will cause the affected local processor to enter decision block 144 of FIG. 9, indicating that it will no longer be involved in the level 1A initialization procedure.

The level 1A initialization procedure described above continues until unique addresses have been assigned to all local processors having serial numbers less than the original vaue of MID. When that happens, the determination of decision block 130 will have to be negative, and the routine will enter block 132 and set the value of DIRECTION to "up". From then on, the determination of decision block 127 will be affirmative, and the routine will enter block 129. Here, the system processor 18 is required to send out the request "If the serial number now being output is greater than MID, send an acknowledge signal". If an acknowledge (interrupt) signal is received from any local processor having a serial number in the upper region of the search, the determination of decision block 133 will be affirmative, and the value of LOW will be set to MID plus 1 and RESPONSE will be set to "true". The routine will then return to decision block 123 and keep repeating this loop until no acknowledge signal is received, which means that the local processor having its serial number equal to the one most recently output by system's processor 18 has been found. This will cause the routine to go through the loop consisting of decision block 124 and 122A, as before, and will assign to that local processor the present value of NEXT.

The routine then repeats the loop through decision blocks 126, 127, 129, 133, and 136 until values of NEXT have been assigned as addresses to all local processors in the upper field of the search. On the last pass, the routine goes through decision block 135.

Next, the "object-building" procedure is described, wherein software representative of all of the interface boards connected to the self configuring system 10 are automatically assembled or "built", in order to avoid the need for software alterations when interface boards are added to or deleted from the system. The basic procedure is described with reference to FIG. 11.

Figure 11:
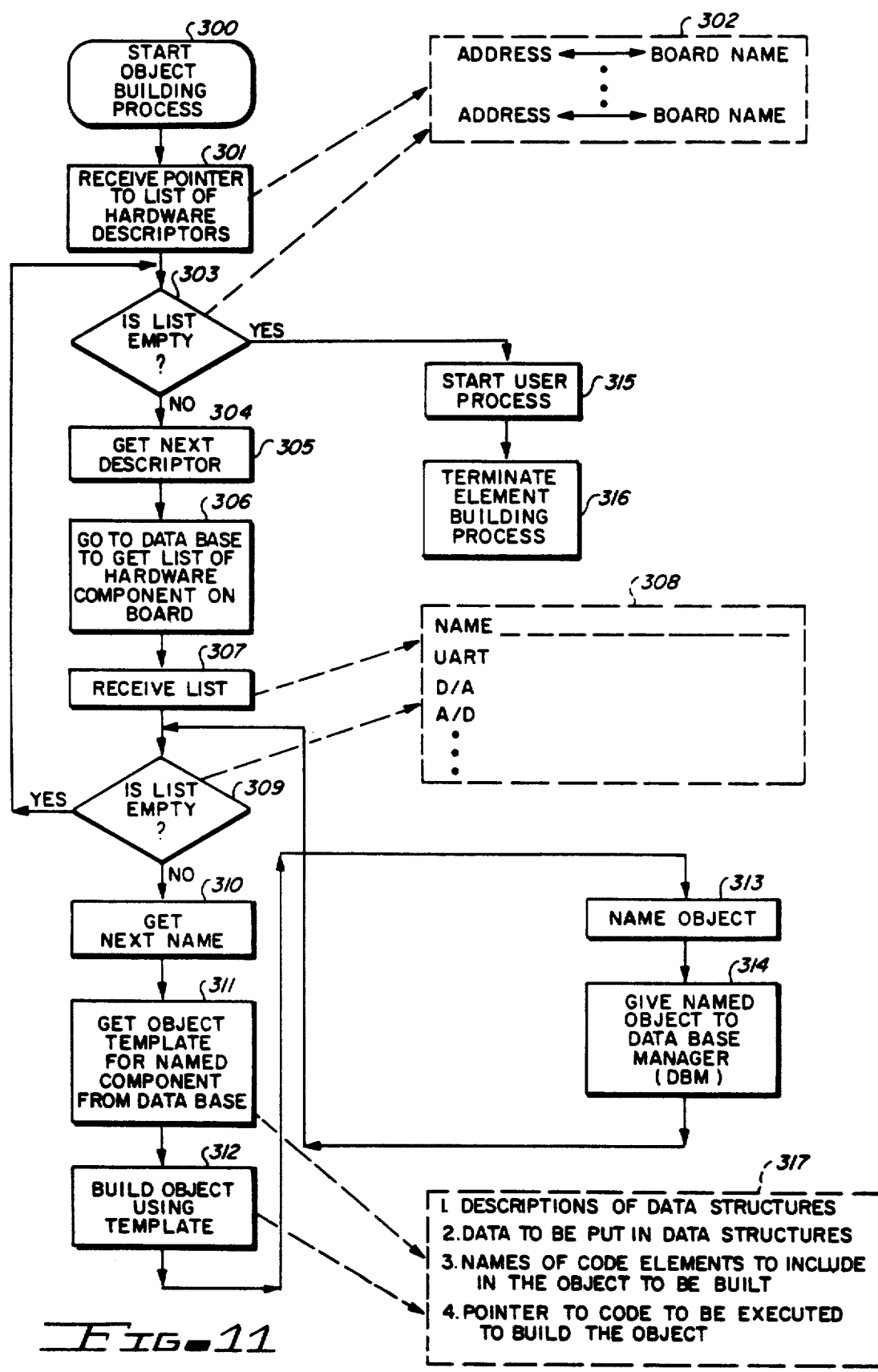
FIG. 11 is a flow chart of a routine which can be executed by the system processor and local processors in the diagram of FIG. 1 to automatically build subroutines which represent the circuitry on the various interface boards connected to the systems.

But before describing FIG. 11, it will be helpful to explain some of the terms used. An object, as used in the description of the invention, is a software entity which can consist of data, code or a combination of both. An object is usually created to represent a function, a set of information or even possibly a function that receives and stores information or returns stored information.

Objects have the property that they may be solely "owned" by an individual user processor or may be shared among several individual and separate user processes. The existence of objects is totally dependent on at least one user process possessing the object in either an exclusive or non-exclusive manner. When no process possesses the object, the object is deleted.

Since objects are entities that are separate from programs, they may be inventoried, issued and received by a software entity that is called a Data Base Manager (DBM). Processes that require a given function make requests to the DBM for the object and, if available, are given the object on either an exclusive or non-exclusive basis. This technique removes from the process specific knowledge of how the specific function is achieved and requires the process to only know what kind of function it requires.

Consequently, several different kinds of objects might possibly exist in a system that provide the same function even though they are inherently quite different. As an example, there might be several kinds of analog to digital converters available for use in a system. If in two systems which use the two different kinds of converters, both converters are named "voltage 5", then a process can request the object "voltage 5" and is assured of achieving the desired result, the measurement of "voltage 5", when utilizing the object.

For further information pertaining to an "object-based operating system", see *HYDAC. mmp: An Experimental Computer System* by Wulf, Lerin, and Harbison, McGraw-Hill, 1981.

The first action that occurs when the object-building routine is started is that it receives a stored list of hardware descriptors. Each descriptor contains a board name and a corresponding assigned address (i.e., the address assigned in the above-described initialization procedures). The first thing that the object building routine does, if that list is not empty, is to get a hardware descriptor, as indicated in block 301 of FIG. 11. If the list is empty, the routine (which is entered at label 300) goes to block 315 and starts executing the initial user program or process. (The term "process" as used herein is a program that has the attributes that it contains one or more user programs, and has the capability of being able to execute the user programs in isolation from other such processes. For a user program to be executed, a process must "contain" that user program. In other words, a user program cannot be executed independently of a process in a multi-process system.) If the determination in decision block 303 is negative, the list is not empty, and therefore, the program enters block 304 and gets the first hardware descriptor. The descriptor that it gets is the first one in the list of hardware descriptors. Dotted line 302 indicates the nature of the list of hardware decriptors. Then, the object building program goes to block 306 and, using the most recently obtained hardware descriptor, goes to a pre-existing data base to get a list of hardware components on the particular printed circuit board for which objects are to be built. (Although not mentioned above, the data base was loaded during the last steps of the prior initializing rountine. Alternately, loading or initializing of the data base routine could be one of the initial steps in the object-building routine). Then, the program goes to block 307, wherein the program performs the function of receiving the list of hardware devices for the present boards. This list is in the form indicated by dotted lines 308. It contains the names of all of the components on the interface board for which a software representation is to be built.

If the list 308 is not empty, the program goes from decision block 309 to block 310 and gets the next name on the list 308. As an example of some of the names that can be on the list 308 of hardware devices on the subject board, there can be various UARTS, digital-to-analog converters, analog-to-digital converters, frequency converters, transducers of various kinds, etc. Note that block 302 designates a list of PC boards that are presently plugged into this system, and list 308 is a list of components of a particular selected one of those boards. Both the board list 302 and the component list 308 are contained in the data base.

As indicated above, the program goes to block 310 and gets the next frame from list 308. The program then goes to block 311 and gets an "object template" for the named component from the data base.

Block 317 indicates the nature of the object template for the named component. The data base contains an object template for each component that is to be used on any interface boards that can be plugged into the self-configuring system of the invention. As indicated in block 317 of FIG. 11, each object template includes descriptions of the data structures of that component. These descriptions include the size of the data structures, the names of the elements that are included in the data structures, and their relative positions within the data structure and are used to effectuate entry of data pertaining to the component (such as the "type" of data structure, the address of the interface board, and the address of the component on the interface board). If, for example, the component is an analog-to-digital converter, the descriptions of the component data structures can include descriptions of a structure for entry of the analog-to-digital converter channel number, the address of a software function that can read the voltage of output lead of the analog-to-digital converter, conversion data, offset data, and a slope number. Another item included in each object template is the data which actually is entered into the above data structures. The third thing included in each component object template is the names of code elements or functions to be included in the object to be built. These names are used to "get" the corresponding functions from the data base. For example, the names of the software function that can read the voltage on the output lead of the analog-to-digital converter could be "analog-to-digital reader", and this name could be used to get that function from the data base. Finally, each object template of a component includes a pointer to code to be executed to build an object. This code points code that requests and receives from the software operating system the memory space in which the object is to be built, code that inserts the present interface board address into the data structure, code that builds the object by taking the name of the code element to be included and receives from the data base manager the address of the code named, for example, "analog-to-digital reader" and puts that address into the data structure, code that creates a name for the object just built, and code that returns to block 312 of FIG. 11.

Then, in block 312, using the object template that was just obtained from the data base, the program "builds" an object as mentioned above. An "object" is a software entity which is managed by the software operating system, and includes things like code segments, data blocks, and subroutines that are controlled by the operating system. The template is an object that contains data that prescribes how to construct a specific type of object. Sometimes, to build a template, the program executes code that utilizes data that is very specific to that code in order to build that template. In a sense, the "template", as the word is used herein is a set of plans that are utilized, in the form of code and data of which the template consists, to build a particular kind of "object" which is a sofware representation of a component of the present printed circuit board. Continuing the analogy, once the template or plans are obtained, it is necessary to "get" components that are prescribed by the plans, i.e., the data or software representation of the various components of the object. This represents "processor number 1, board number 5, plug number 3, pin 5, analog-to-digital converter".

Next, the element building routine of FIG. 11 goes from block 312 to block 313 and assigns a unique name to the "object" it has just built. An example of a "defining name" of an object that might be built is CPU:1:BD5:P3:PN5:ATOD. The element or object that has been built could be a subroutine of a data block or both. If this object is a subroutine, the object can be utilized by a process to "get" a voltage or current corresponding to the particular lead of the above-mentioned analog-to-digital converter.

Referring to block 314, the data base manager is given the object just built and inventories it, so that any process that requires such a function can ask the data base manager for the object and obtain it. The data base manager is a routine that represents a centralized information store of the "objects" that are available for use by processes that are executable by any local processor. One way of looking at the object given in the example above, is that if the voltage function that is a particular lead of an analog-to-digital converter (namely lead 5) is required, the corresponding software object can be obtained once it has been created by any process to obtain the voltage on lead 5.

Later, if the board is removed, all of the objects that correspond to it are automatically deleted. Every lead or voltage or function that one might want to read and/or control on every interface board that is plugged into the system has an "object that is automatically built by the system, when it is powered up, or in some cases, even "on the fly", i.e., while the system is operating. The program then returns to decision block 309 and determines if all of the components in list 308 have been exhausted.

If the list of boards 302 is empty in decision block 303, then the routine starts the user process, according to block 315. Then, the element building routine 300 is terminated because it is no longer needed, and running of the user process continues. When the user process needs some objects it can obtain them, or else it can begin execution of other processes which, in turn, will get the needed objects. Thus, the objects that are automatically built are the things that at least some of the user processes need in order to perform their intended tasks. Thus, the user programs do not need to be modified when new hardware and/or software modules are added to the system.

The data base referred to in block 314 has in it the various hardware objects that have been created. The templates referred to in block 311 for the various hardware objects that can be created are also contained in the data base. The data base also contains lists of hardware components (designated as block 308) contained on the various types of interface boards that can be used in the self-configuring system. There will also be lists of names which, in effect, are short names or nicknames for the other longer "defining" names of objects. These are names easily recognized by the user in lieu of the longer defining names that precisely identify the components of an object that has been built. As an example, the analog-to-digital converter object that was referred to by the defining name CPU:1:BD5:P3:PN5:ATOD might be known to the user as "oven temperature". The data base can contain in its "nickname list" the name "oven temperature" paired with the above defining name. Whenever the user requests from the data base manager the object named "oven temperature", that user program will receive the object CPU:1:BD5:P3:PN5:ATOD.

The "nicknaming capability" of the DBM further enhances the reconfigurability of the system 10 by allowing the user to insert a different kind of interface board in the system that contains (for example) the analog-to-digital converter, connect the "oven temperature" lead to that converter, and then instruct the data base manager to change the "nickname" such that the name "oven temperature" is now paired with the new hardware object that was created when the interface board was plugged in and the system initialized. When the user process now requests an object to perform the function of reading the "oven temperature", a totally different object that performs the desired function is now received. In performing these actions, the user has not been required to change any software that has been written or reprogram the operating system in any way to achieve the result that has been achieved.

If a new interface board is designed, several actions are required to allow that board to be used in the system. First, a list (of the type referred to in block 302) must be constructed and then given the data base manager to inventory. Second, if any hardware components contained on the new board type are also new, templates for those components must be constructed and then given to the data base manager to inventory. If any of the hardware components already exist in the system, no action need be taken other than naming them in the board list (for example, see block 308) of components. Other than composing new lists and creating the templates necessary to construct the new objects (which actions are taken totally independently of the existing system), no action other than giving these new things to the DBM for inventory must be taken to allow the user to insert the new interface board and allow the system to make use of its new features. No changes to the existing code of the operating system or to user programs need take place. If totally new features have been introduced by the new board, the user might then wish to write new programs or change existing programs to make use of the new features which were not previously envisioned at the time of creation of the system.

FIGS. 12A-12F disclose a flow chart indicating the procedure during which user processes which need to communicate with other processes can pass messages between themselves, both when the two processes involved co-reside in the same local processor and also when they reside in different local processors, respectively. At the outset, it should be appreciated that message passing between different user programs in multiprocessor systems is conventional and does not, per se, constitute part of the present invention, but is being included as an aid to overall understanding of the operation of the self-configuring computer system of the present invention after that self-configuring occurs.

Those skilled in the art know that messages in multiprocessor systems consist of strings of code including a header which includes at least a destination address and may include a source address, the destination address being the address or a representation thereof for the user process to which the message is to be sent. The source address is the address, or a representation or "nickname" of the user process instituting or sending the message. In addition to this header, the message includes the body of the message to be sent. The body of the message is the data.

The purpose of including the source address in the address header, of course, is to enable the message to be conveniently replied to. When the destination process is located in a different processor than the processor which is the source of the message, the system processor performs the function of taking the message out of the source processor's dual port random access memory and routing it to the destination processor. In accordance with the present invention, if the destination address in the header of the message received by the system processor is an "alias", the system processor may contain a routine to convert that alias address into the physical address of the destination processor and the destination process within the destination processor. Alternately, as part of the initialization process, all of the local processors that are connected to the system bus may exchange identification information with each other so that each knows the address of the other and each has the stored information necessary to convert nickname or alias addresses to physical addresses of user processes stored therein.

Basically, the message passing scheme can be broken down into three categories, namely, transmitting the message by one user process, receiving the message by another user process and, if the source process and destination process reside in different local processors, forwarding of the message by the system processor from the dual port memory of the source processor to the dual port memory of the destination processor. Referring now to FIG. 12A, the message transmit routine is shown, which is executed by the local processor in which the user process wishing to send the subject message resides. This routine is entered via label 600, and in decision block 601 makes the determination as to whether the destination of the message is in the same local processor or in a remote local processor. If the determination is affirmative, the routine goes to block 602 and performs the routine shown in FIG. 12B. If the determination of decision block 601 is negative, the routine goes to block 603 and performs the remote message transmitting routine of FIG. 12C. The routine is then exited via label 604. Note that the destination process does not make the determination itself as to whether the destination process co-resides in the same local processor or resides in a remote local processor.

Referring now to FIG. 12B, the routine for transmitting a message to a co-resident process is entered via label 610. In block 611, this routine puts the message into the receive queue of the destination process. Of course, each process in the system has a receive queue and a send queue. The routine then goes to decision block 612 and determines whether the destination process is waiting for a message. If this determination is affirmative, the routine goes to block 613 and performs the function of alerting the destination process to receive the message. If a determination of decision block 612 is negative, the routine is then simply exited via label 614, which also happens after the function of block 613 is completed. The passing of the message is complete, and the destination process then uses the message. (It should be appreciated that the message passing functions performed in each local processor are performed by that local processor's operating system).

Referring next to FIG. 12C, the routine performed by a local processor to accomplish passing of a message to a destination process that resides in a remote local processor, this routine is entered via label 621. In block 622, this routine locates the address of the remote local processor in which the destination process resides.

One of the ways in which this can be done is to have the necessary information for locating the processor in which the destination process is located stored in the system processor. In some respects, this is an undesirable approach, because it is preferable to minimize the amount of "intelligence" that must be stored in the system processor as additional local processors and their associated local buses and interfaces are added to the self-configuring network system of FIG. 1 and as additional user processes are loaded into the system.

Another approach is to have information regarding the processors in which various processes are stored available in each local processor, as this approach would enhance the modularity of the system.

Note that it is desirable to minimize the amount of address translating and locating that must be performed by the system processor during the message passing operation in order to enable the system processor to pass the messages as fast as possible.

Next, the routine executed by the local processor in order to cause it to transmit a message from a process residing therein to a process residing in a remote local processor is described with reference to FIG. 12C. This routine is entered via label 621. In block 622, it locates the address of the remote local processor in which the destination process is located. Then, in block 623, the routine attaches that address (of the destination processor) to the message to be transmitted. Then, the routine goes to block 624 and puts that message in a queue which contains messages which are to be transmitted to the system processor. The address referred to in block 622 might be the name of the processor in which the destination process is located. That name could be a "logical" address rather than a physical name, of the processor in which the destination process is located, and if so, that logical address is translated into the physical address of the remote local processor containing the destination process and transmitted thereto. In a typical system, there will be several modes of addressing, including addressing by a physical location address and logical addressing, so that if a user process desires to send a message to a particular physical address, it can, but if the user process doesn't care to which physical address the message is to be sent, and in general it won't, then it can address a process by its name instead. The queue referred to in block 624 is located in the dual port RAM of the local processor. The remote transmit routine of FIG. 12 then exits via label 625.

Referring now to FIG. 12D, the routine shown indicates the program executed by the system processor 18 to accomplish its role in the message passing procedure. The system processor continually loops through this routine. In decision block 630, it determines whether for a particular local processor there is any message in the "SPU transmit" queue. The routine, essentially continually polls all of the SPU transmit queues in all of the local processes connected to system bus 20 to see if there are messages there for the system processor. If a determination of decision block 630 is negative, the routine goes to block 631 and causes it to return to decision block 630 and repeat the process for the next local processor connected to the system bus 20. If a determination of decision block 630 is affirmative, the routine goes to decision block 632, which makes the same determination again. If the determination of decision block 632 is affirmative, the routine goes to decision block 633 and moves the message in the SPU transmit queue of to the "destination processor receive queue" the system processor. (Every local processor has a transmit queue and a receive queue for messages to be transmitted to the system processor and received from the system processor, respectively.) In block 634, the routine informs the destination local processor that there is a message for it in its SPU receive queue. The routine then goes back to decision block 632 and continues until the destination processor SPU receive queue is emptied, and then goes to block 631 and moves on to the next local processor.

Preferably, block 633 is a relatively simple step, but if message translation tasks are assigned to the system processor 18, then that function would be performed in block 633. Preferably, however, the message translation, especially translation of "nickname" addresses of the destination of the remote local processor in which the destination process is located, is done within the local processor, to leave the system processor free to perform its basic message forwarding function at the highest possible speed. Those skilled in the art know that there are conventional techniques in which every local processor on a network can send its address to every other local processor so that when this procedure is completed, every local processor knows of the existence of and address of every other local processor on the network, and, except for the basic message forwarding role played by the system processor, each local processor can completely effectuate transmission of its own messages.

Figure 12E:
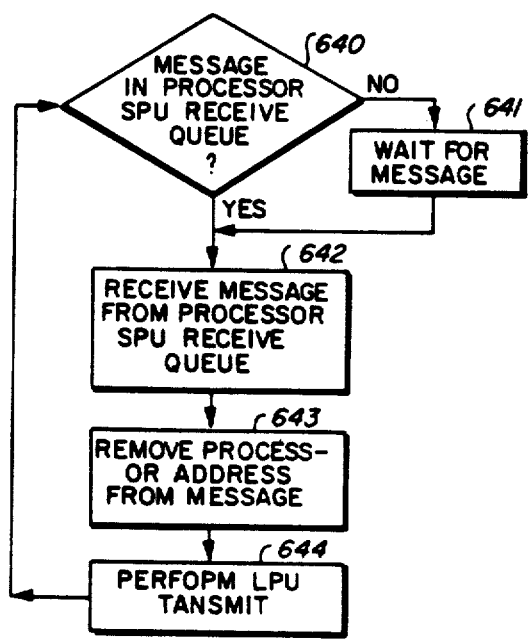

Next, with reference to FIG. 12E, the routine executed by a local processor to receive a message for a destination process contained in that local processor is described. Stated differently, it is the routine performed by a remote receiver when it receives a message from the system processor. The system processor has interrupted the local processor, which enters the routine of FIG. 12E by entering decision block 640.

In decision block 640 the routine determines if there is a message in that local processor's SPU receive queue. If this determination is negative, the routine goes to block 641 and waits until there is a message in the receiving local processor's SPU receive queue. If a determination of decision block 640 is negative, the routine goes to block 642. In block 642, the routine removes the message from the SPU receive queue of the local processor and, in block 643, removes the processor address from that message. The routine then goes to block 644 and performs a local processor transmit function of the types referred to in FIG. 12A. At this point, the transmission would be determined, in block 601, to be a local transmission, so the destination processor would execute the routine of FIG. 12B. Stated differently, the local processor in which destination process resides simply receives the message.

Figure 12F:
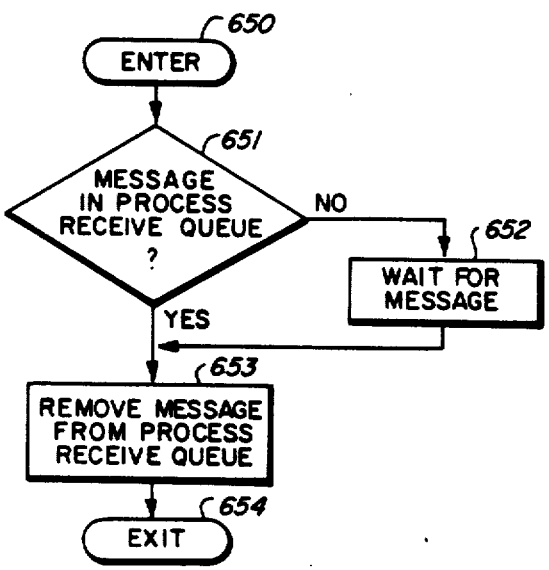

Referring now to FIG. 12F, the operation is described for this case wherein a process contained therein is the destination process for a message transmitted from another source process residing in that same local processor. This routine is entered via label 650 and enters decision block 651, where it determines if there is a message in its process received queue. If there is not, it goes to block 652 and waits for a message in the receive queue. If the determination of decision block 651 is affirmative, the routine goes to block 653 and removes that message from the process receive queue and the destination process then uses the message, and the routine of FIG. 12F is exited via label 654.

While the invention has been described with reference to a particular embodiment thereof, those skilled in the art will be able to make various modifications without departing from the true spirit and scope of the invention.

We claim:

1. A reconfigurable bus structure in a system including a first processor and a first group of interface circuits for connection to said first processor, said first processor and each of said interface circuits each being in electrical communication with a plurality of edge connector conductors, said reconfigurable bus structure comprising in combination:
   a mother board having a plurality of edge connecting means for connection to the edge connector conductors of various ones of said interface circuits and said first processor;
   a plurality of local bus segments disposed on said mother board, each of said local bus segments including a first number of conductors each having separate first and second electrical contact areas which are disposed on opposite sides of adjacent ones of said edge connecting means;
   a first processor board on which said first processor is disposed, said first processor board having a second number of edge connector conductors, each of which has a first electrical contact area, for electrically contacting said first electrical contact areas of a corresponding one of said local bus segments, said second number being equal to said first number; and
   a first group of interface boards on which said interface circuits of said first group are disposed, respectively, each of said interface boards having thereon a third number of edge connector conductors, each of which has a first electrical contact area for electrically contacting corresponding ones of said first electrical contact area of conductors of one of said local bus segments on a first side of one of said edge connecting means into which that interface board is plugged, each of said third number of edge connector conductors also having a second electrical contact area for electrically contacting corresponding ones of said second electrical contact areas of conductors of another one of said local bus segments on a second side of that edge connecting means, said third number being equal to said first number, wherein when said first processor board is plugged into a first edge connecting means of said mother board, the first electrical contact areas of each of the edge connector conductors of said first processor board electrically contacts corresponding ones of the first electrical contact areas of conductors of one of said local bus segments on a first side of a first one of said edge connecting means, wherein when each of said interface boards of said first group is plugged into a respective, successive one of the rest of said edge connecting means, the first electrical contact areas of the edge connector conductors of that interface board respectively electrically contact corresponding ones of the first electrical contact areas of conductors at another one of said local bus segments on a first side of of that edge connecting means, and the second electrical contact areas of the edge connector conductors of that interface board respectively electrically contact corresponding ones of the second electrical contact areas of conductors of another one of said local bus segments on a second side of that edge connecting means, whereby physical insertion of said first processor board and said interface boards of said first group into successive edge connecting means of said mother board automatically creates a local bus of the needed length operatively connecting said first processor to said interface circuits of said first group.

2. The reconfigurable bus structure of claim 1 wherein no edge connector conductor of said first processor board electrically contacts the second electrical contact area of any of said conductors of any of said local bus segments 3. The reconfigurable bus structure of claim 2 including a second processor on a second processor board similar to said first processor board and a second group of interface circuits disposed on respective ones of a second group of interface boards similar to said interface boards of said first group, said second processor board and said interface boards of said second group being plugged into successive adjacent edge connecting means of said mother board to create a second local bus that is electrically isolated from said first local bus.

4. The reconfigurable bus structure of claim 3 wherein said mother board includes a plurality of additional bus conductors which are included in a system bus which is electrically isolated from said first and second local buses, some additional electrical contact areas being disposed in each of said edge connecting means being also connected to respective corresponding conductors of said system bus, each of said first and second processor boards having additional edge connector conductors for electrically contacting said additional electrical contact areas of the slots into which said first and second processor boards are plugged.

5. A reconfigurable bus structure in a system including a mother board, a processor board having a first processor thereon, and a first interface board, the reconfigurable bus structure comprising in combination:
   (a) a plurality of separate bus segments on the mother board, each of the bus segments including a plurality of separate bus conductors each having a first end and a second end;
   (b) first and second sets of interface board connector conductors on the first interface board and a first set of processor board connector conductors on the processor board;
   (c) processor board connecting means for plug-in connecting of the first set of processor board connector conductors to corresponding first ends of the bus conductors of a first one of the bus segments;
   (d) first interface board connecting means for plug-in connecting of the first set of interface board connector conductors to corresponding second ends of the bus conductors of the first bus segments, and plug-in connecting of the second set of interface board connector conductors to corresponding first ends of the bus conductors of a second one of the bus segments; and
   (e) means on the first interface board for electrically coupling the corresponding interface board conductors of the first and second sets, whereby connecting the first interface board and the processor board to the mother board creates a local bus including the first and second segments.

6. The reconfigurable bus structure of claim 5 including a second interface board having first and second sets of interface board connector conductors and second interface board connecting means for plug-in connecting of the first set of interface board connector conductors of the second interface board to corresponding second ends of the bus conductors of the second bus segment and plug-in connecting of the second set of interface board connector conductors of the second interface board to corresponding first ends of the bus conductors of a third bus segment, and means on the second interface board for electrically coupling the corresponding interface board conductors of the first end and second sets of the second interface board, whereby connecting of the second interface board to the mother board extends the local bus to include the third bus segment.

7. The reconfigurable bus structure of claim 6 wherein no processor connector conductors of the processor board is directly connected to any other bus segment than the first bus segment.

* * * * *